(12) United States Patent
Lee et al.

(10) Patent No.: US 11,804,513 B2
(45) Date of Patent: Oct. 31, 2023

(54) SEMICONDUCTOR LIGHT-EMITTING DEVICES AND METHODS OF MANUFACTURING THE SAME

(71) Applicant: SAMSUNG ELECTRONICS CO., LTD., Suwon-si (KR)

(72) Inventors: Sangbum Lee, Hwaseong-si (KR); Inho Kim, Hwaseong-si (KR); Geunwoo Ko, Yongin-si (KR); Yongmin Kwon, Hwaseong-si (KR); Juhyun Kim, Seoul (KR); Jungwook Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 332 days.

(21) Appl. No.: 17/181,213

(22) Filed: Feb. 22, 2021

(65) Prior Publication Data
US 2021/0366982 A1 Nov. 25, 2021

(30) Foreign Application Priority Data

May 22, 2020 (KR) .......................... 10-2020-0061930

(51) Int. Cl.
*H01L 27/15* (2006.01)
*H01L 33/00* (2010.01)
(Continued)

(52) U.S. Cl.
CPC ........ *H01L 27/156* (2013.01); *H01L 33/0093* (2020.05); *H01L 33/382* (2013.01); *H01L 33/44* (2013.01); *H01L 33/505* (2013.01); *H01L 33/60* (2013.01); *H01L 33/62* (2013.01); *H01L 2933/0016* (2013.01); *H01L 2933/0025* (2013.01); *H01L 2933/0041* (2013.01);
(Continued)

(58) Field of Classification Search
None
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

JP 2019102664 A 6/2019

*Primary Examiner* — Robert K Carpenter
(74) *Attorney, Agent, or Firm* — Sughrue Mion, PLLC

(57) ABSTRACT

A semiconductor light-emitting device includes a light-emitting pixel region and a pad region, and includes light-emitting structures, a partition wall structure, a passivation structure, and a fluorescent layer, positioned in the light-emitting pixel region, and a pad unit positioned in the pad region. The partition wall structure includes partition walls defining pixel spaces. The passivation structure surrounds the partition walls and includes a first passivation layer including a first insulating material and a second passivation layer including a second insulating material different from the first insulating material. The passivation structure includes a first portion on a top surface of the partition walls, a second portion on a sidewall of the partition walls, and a third portion between the light-emitting structures and the fluorescent layer. A first thickness of the first portion is less than or equal to a second thickness of the second portion.

20 Claims, 34 Drawing Sheets

(51) Int. Cl.
   *H01L 33/38*     (2010.01)
   *H01L 33/44*     (2010.01)
   *H01L 33/50*     (2010.01)
   *H01L 33/60*     (2010.01)
   *H01L 33/62*     (2010.01)

(52) U.S. Cl.
   CPC ............... *H01L 2933/0058* (2013.01); *H01L 2933/0066* (2013.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,905,543 B2 | 2/2018 | Yeon et al. |
| 10,096,750 B2 | 10/2018 | Choi et al. |
| 10,403,608 B2 | 9/2019 | Sim et al. |
| 2018/0166424 A1* | 6/2018 | Sim ............... H01L 33/483 |
| 2019/0198589 A1* | 6/2019 | Choi ............ H10K 50/818 |
| 2019/0393279 A1 | 12/2019 | Lee et al. |
| 2020/0011518 A1* | 1/2020 | Ko ............... H01L 25/167 |
| 2020/0105980 A1 | 4/2020 | Sim et al. |

\* cited by examiner

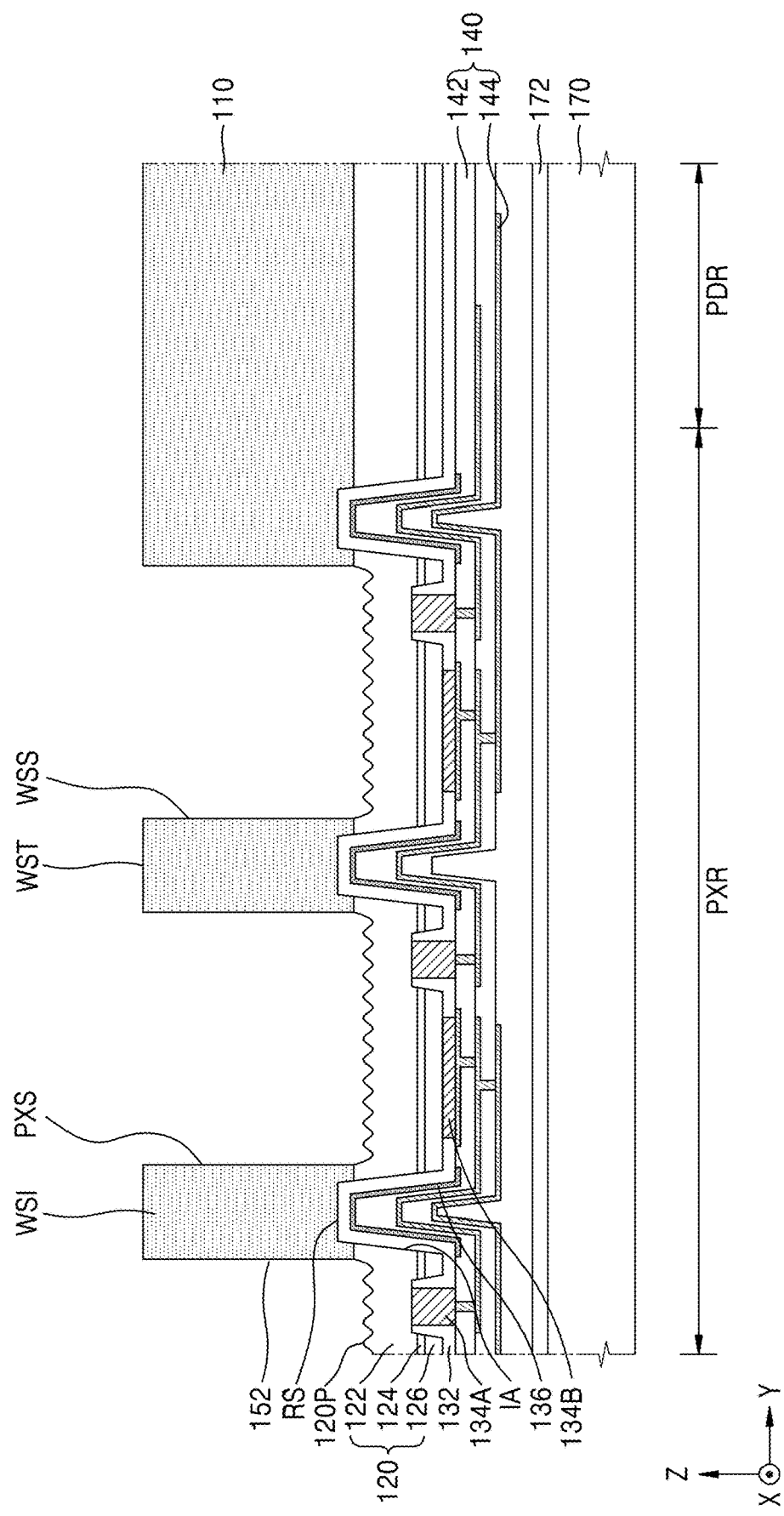

SEMICONDUCTOR LIGHT-EMITTING DEVICES AND METHODS OF MANUFACTURING THE SAME

CROSS-REFERENCE TO THE RELATED APPLICATION

This application claims priority from Korean Patent Application No. 10-2020-0061930, filed on May 22, 2020, in the Korean Intellectual Property Office, the disclosure of which is incorporated by reference herein in its entirety.

BACKGROUND

The inventive concept relates to a semiconductor light-emitting device and a method of manufacturing the same, and more particularly, to a pixel-type semiconductor light-emitting device and a method of manufacturing the same.

There is an increasing demand for using semiconductor light-emitting devices in various lighting apparatuses such as automotive headlamps or indoor lighting. For example, an intelligent lighting system has been proposed, in which a light source module includes a plurality of light-emitting device chips and each light-emitting device chip is individually controlled to implement various lighting modes according to surrounding conditions. However, in order to implement such an intelligent lighting system, the optical characteristics and reliability of light-emitting devices need to be improved.

SUMMARY

The inventive concept provides a pixel-type semiconductor light-emitting device having excellent optical characteristics and high reliability and a method of manufacturing the pixel-type semiconductor light-emitting device.

According to an aspect of the inventive concept, there is provided a semiconductor light-emitting device including a light-emitting pixel region and a pad region. The semiconductor light-emitting device includes a plurality of light-emitting structures positioned in the light-emitting pixel region, and a partition wall structure positioned in the light-emitting pixel region and at a different vertical level from the plurality of light-emitting structures. The partition wall structure includes a plurality of partition walls defining a plurality of pixel spaces. A passivation structure surrounds a top surface and a sidewall of each of the plurality of partition walls. The passivation structure includes a first passivation layer includes a first insulating material and a second passivation layer including a second insulating material. The second insulating material is different from the first insulating material. A fluorescent layer is positioned on the passivation structure and fills the plurality of pixel spaces. A pad unit is positioned in the pad region and on at least one side of the plurality of light-emitting structures. The passivation structure includes a first portion positioned on the top surface of each of the plurality of partition walls, a second portion positioned on the sidewall of each of the plurality of partition walls, and a third portion positioned between the plurality of light-emitting structures and the fluorescent layer, and a first thickness of the first portion is less than or equal to a second thickness of the second portion.

According to another aspect of the inventive concept, there is provided a semiconductor light-emitting device including a support substrate, a plurality of light-emitting structures positioned on the support substrate and spaced apart from each other by a device isolation region, and a partition wall structure positioned on the plurality of light-emitting structures and including a plurality of partition walls. The plurality of partition walls define a plurality of pixel spaces, and the plurality of pixel spaces vertically overlap the plurality of light-emitting structures, respectively. A passivation structure is positioned on a top surface and a sidewall of each of the plurality of partition walls and bottoms of the plurality of pixel spaces. The passivation structure includes a first portion positioned on the top surface of each of the plurality of partition walls, a second portion positioned on the sidewall of each of the plurality of partition walls, and a third portion positioned on the bottoms of the plurality of pixel spaces. A first thickness of the first portion is less than or equal to a second thickness of the second portion. A fluorescent layer is positioned on sidewalls of the passivation structure and fills the plurality of pixel spaces. A lower reflective layer is positioned on an inner wall of the device isolation region between two adjacent light-emitting structures of the plurality of light-emitting structures. The lower reflective layer vertically overlaps the plurality of partition walls. A pad unit is positioned on at least one side of the plurality of light-emitting structures.

According to another aspect of the inventive concept, there is provided a semiconductor light-emitting device including a support substrate, a plurality of light-emitting structures positioned on the support substrate and spaced apart from each other by a device isolation region, and a partition wall structure positioned on the plurality of light-emitting structures and including a plurality of partition walls. The plurality of partition walls define a plurality of pixel spaces, and the plurality of pixel spaces vertically overlap the plurality of light-emitting structures, respectively. A passivation structure is positioned on a top surface and a sidewall of each of the plurality of partition walls and bottoms of the plurality of pixel spaces. The passivation structure includes a first portion positioned on the top surface of each of the plurality of partition walls, a second portion positioned on the sidewall of each of the plurality of partition walls, and a third portion positioned on the bottoms of the plurality of pixel spaces. A first thickness of the first portion is less than or equal to a second thickness of the second portion. A fluorescent layer is positioned on sidewalls of the passivation structure and fills the plurality of pixel spaces. A lower reflective layer is positioned on an inner wall of the device isolation region between two adjacent light-emitting structures of the plurality of light-emitting structures. The lower reflective layer vertically overlaps the plurality of partition walls. A pad unit is positioned on at least one side of the plurality of light-emitting structures. The pad unit has a top surface positioned at a lower level than a top surface of the partition wall structure.

BRIEF DESCRIPTION OF THE DRAWINGS

Embodiments of the inventive concept will be more clearly understood from the following detailed description taken in conjunction with the accompanying drawings in which:

FIGS. 18A to 18M are cross-sectional views illustrating a process sequence of a method of manufacturing a semiconductor light-emitting device, according to example embodiments;

DETAILED DESCRIPTION

Figure 1:
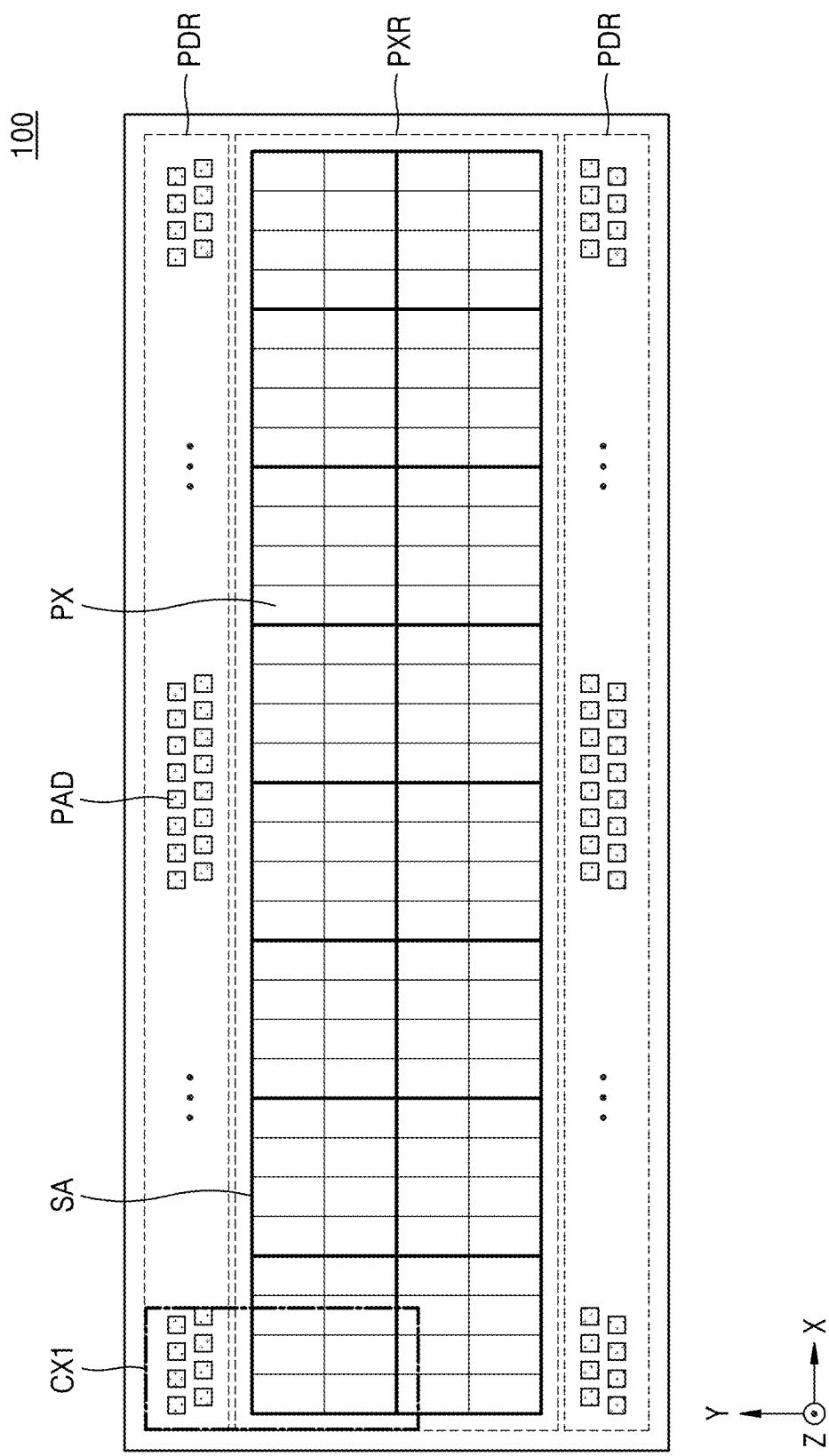
FIG. 1 is a plan view of a semiconductor light-emitting device according to example embodiments.

Hereinafter, embodiments will be described in detail with reference to the accompanying drawings. The same reference numerals are used to denote the same elements in the drawings, and repeated descriptions thereof will be omitted.

Unless explicitly described to the contrary, the word "comprise" and variations such as "comprises" or "comprising" will be understood to imply the inclusion of stated elements but not the exclusion of any other elements.

It will be understood that, although the terms first, second, etc. may be used herein to describe various elements, these elements should not be limited by these terms. These terms are only used to distinguish one element from another. Any references to a singular element may include plural elements unless expressly stated otherwise. The term "plurality of" mentioned in the specification means two or more.

The character "/" in this specification generally indicates an "or" or "and/or" relationship between the associated elements. As used herein, the term "and/or" includes any and all combinations of one or more of the associated listed items. Expressions such as "at least one of," when preceding a list of elements, modify the entire list of elements and do not modify the individual elements of the list.

In addition, it will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present.

Figure 2:
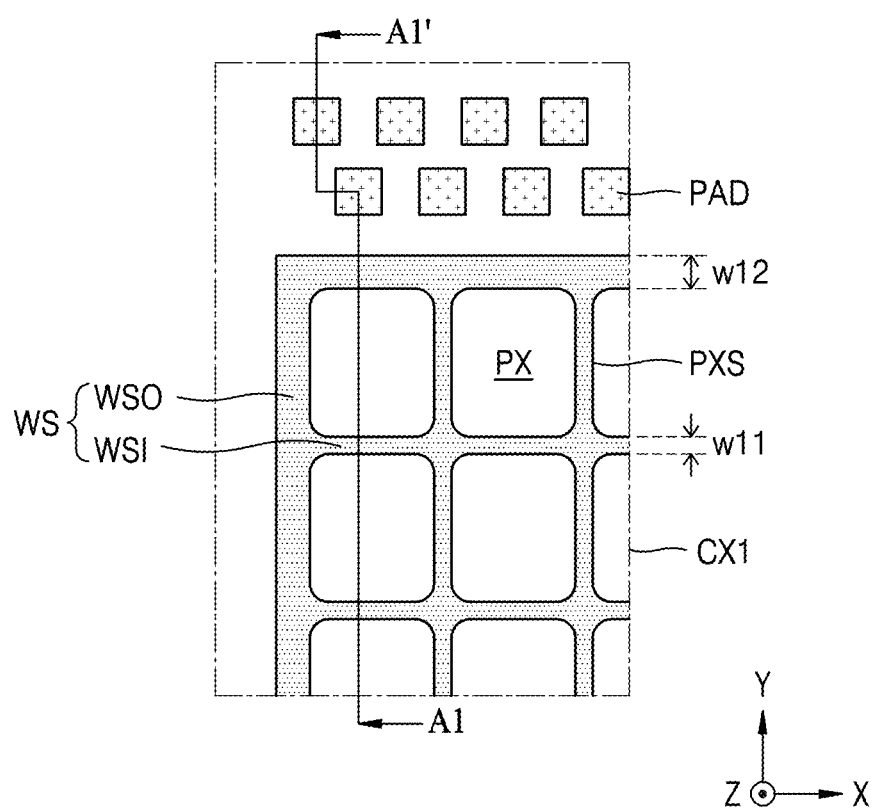
FIG. 2 is an enlarged view of a portion CX1 of FIG. 1.
Figure 3:
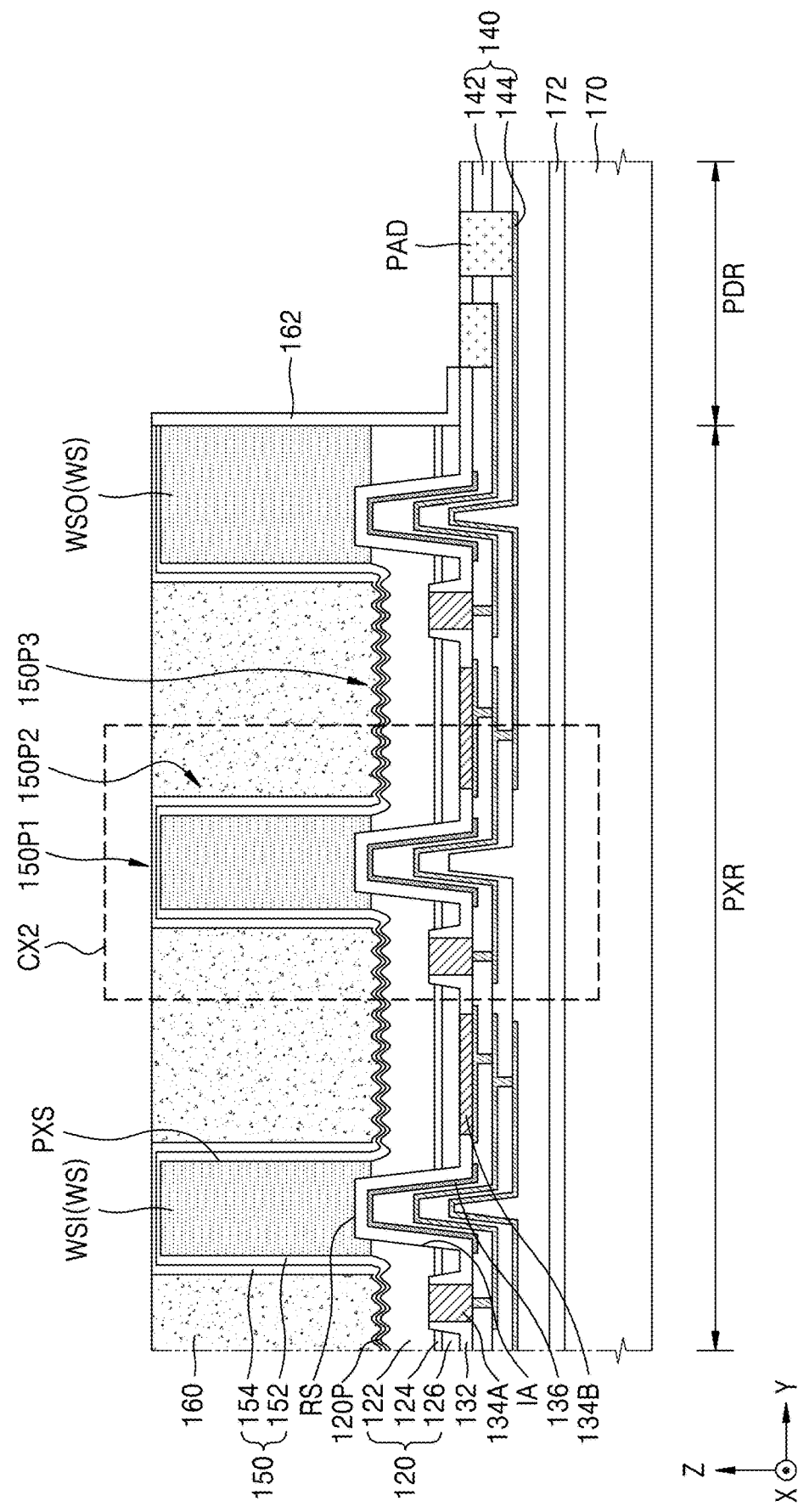
FIG. 3 is a cross-sectional view taken along line A1-A1' of FIG. 2.
Figure 4:
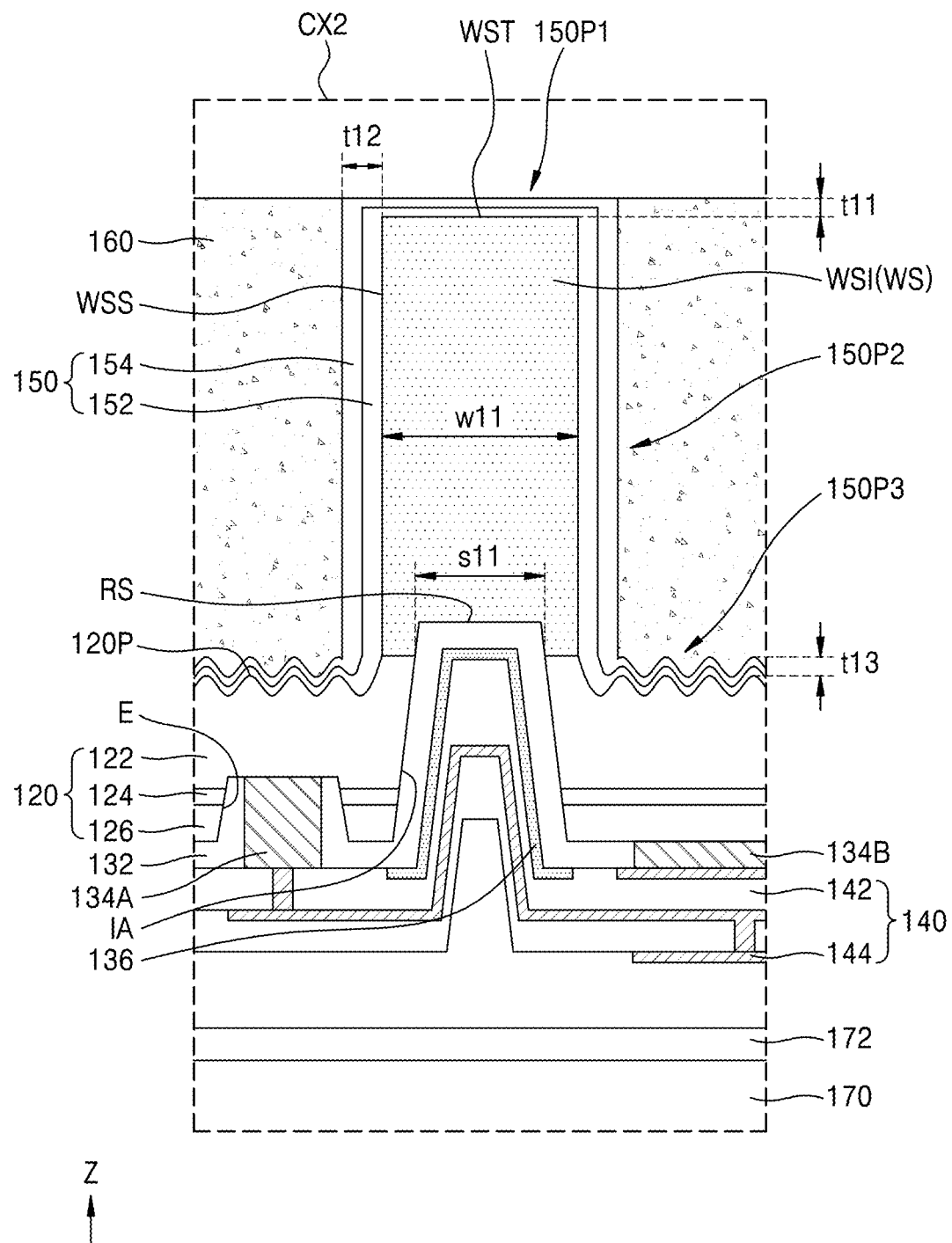
FIG. 4 is an enlarged view of a portion CX2 of FIG. 3.

FIG. 1 is a plan view of a semiconductor light-emitting device 100 according to example embodiments. FIG. 2 is an enlarged view of a portion CX1 of FIG. 1. FIG. 3 is a cross-sectional view taken along line A1-A1' of FIG. 2. FIG. 4 is an enlarged view of a portion CX2 of FIG. 3. Only some components of the semiconductor light-emitting device 100 are illustrated in FIGS. 1 and 2.

Referring to FIGS. 1 to 4, the semiconductor light-emitting device 100 may include a light-emitting pixel region PXR and a pad region PDR positioned in at least one side of the light-emitting pixel region PXR. A plurality of pixels PX may be arranged in a matrix form in the light-emitting pixel region PXR, and a plurality of light-emitting structures 120 may be positioned in the pixels PX, respectively. A pad unit PAD may be arranged in the pad region PDR and electrically connected to a light-emitting structure 120 arranged in each of the pixels PX.

In example embodiments, in a plan view, the light-emitting pixel region PXR may have an area corresponding to about 50% to about 90% of the total area of the semiconductor light-emitting device 100, and the pad region PDR may have an area corresponding to about 10% to about 50% of the total area of the semiconductor light-emitting device 100, but the inventive concept is not limited thereto. In a plan view, each of the pixels PX may have an X-directional length (or a width) or a Y-directional length (or a height) of about 10 µm to several mm, but is not limited thereto.

The semiconductor light-emitting device 100 may include a plurality of sub-arrays SA, each of which may include a plurality of pixels PX. For example, FIG. 1 illustrates a case in which the semiconductor light-emitting device 100 includes 16 sub-arrays SA, each of which includes 8 pixels PX arranged in a matrix form. However, the arrangement of sub-arrays SA and the number of pixels PX included in each of the plurality of sub-arrays SA may vary.

In example embodiments, the plurality of sub-arrays SA may be electrically isolated from each other, and the plurality of pixels PX included in one sub-array SA may be connected in series to each other. For example, each of the plurality of sub-arrays SA may be electrically connected to the same driver chip (not shown) and configured such that one driver chip controls one sub-array SA. In this case, the number of sub-arrays SA may be equal to the number of driver chips. In other embodiments, the pixels PX included in at least one of the plurality of sub-arrays SA may be connected in parallel to each other.

Partition wall structures WS may be positioned on the plurality of light-emitting structures 120. As shown in FIG. 2, the partition wall structure WS may include a plurality of partition walls WSI defining a plurality of pixel spaces PXS in the pixel region PXR and an outer partition wall WSO positioned at an outermost portion of the partition wall structure WS. Pixels PX may be arranged in the plurality of pixel spaces PXS, respectively.

Each of the plurality of partition walls WSI may have a first width w11 of about 10 µm to about 100 µm in a lateral direction (i.e., Y direction). The outer partition wall WSO may have a second width w12 of about 10 µm to about 1 mm in the lateral direction (i.e., the Y direction). The partition wall structure WS may be formed such that the outer partition wall WSO is formed to have the second width w12 greater than the first width w11 of the plurality of partition walls WSI. Thus, the structural stability of the semiconductor light-emitting device 100 may be improved. For example, even when repetitive vibration and impact are applied to the semiconductor light-emitting device 100 in the case, for example, where the semiconductor light-emitting device 100 is used as a headlamp for a vehicle, the reliability of the semiconductor light-emitting device 100 may be improved by excellent structural stability between the partition wall structures WS and a fluorescent layer 160 positioned within the partition wall structures WS.

Each of the plurality of light-emitting structures 120 may include a first conductive semiconductor layer 122, an active layer 124, and a second conductive semiconductor layer 126. An insulating liner 132, a first contact 134A, a second contact 134B, and a wiring structure 140 may be positioned on a bottom surface of each of the plurality of light-emitting structures 120.

For brevity of description, as shown in FIG. 3, a surface of the light-emitting structure 120, which faces the plurality of partition walls WSI, may be referred to as a top surface of the light-emitting structure 120, and a surface of the light-emitting structure 120 opposite to the top surface of the light-emitting structure 120 (i.e., a surface of the light-emitting structure 120 positioned farther away from the plurality of partition walls WSI) may be referred to as a bottom surface of the light-emitting structure 120. For example, the first conductive semiconductor layer 122, the active layer 124, and the second conductive semiconductor layer 126 may be stacked in a vertical direction from the top surface of the light-emitting structure 120 to the bottom surface thereof. Thus, the top surface of the light-emitting structure 120 may correspond to a top surface of the first conductive semiconductor layer 122, and the bottom surface of the light-emitting structure 120 may correspond to a bottom surface of the second conductive semiconductor layer 126.

The first conductive semiconductor layer 122 may be a nitride semiconductor having a composition of n-type $In_xAl_yGa_{(1-x-y)}N$ (where $0 \leq x<1$, $0 \leq y<1$, and $0 \leq x+y<1$). For example, n-type impurities may include silicon (Si). For example, the first conductive semiconductor layer 122 may include GaN containing the n-type impurities.

In example embodiments, the first conductive semiconductor layer 122 may include a first conductive semiconductor contact layer and a current diffusion layer. An impurity concentration of the first conductive semiconductor contact layer may be in a range of $2 \times 10^{18}$ cm$^{-3}$ to $9 \times 10^{19}$ cm$^{-3}$. A thickness of the first conductive semiconductor contact layer 122 may be about 1 μm to about 5 μm. The current diffusion layer may have a structure in which a plurality of $In_xAl_yGa_{(1-x-y)}N$ layers (where $0 \leq x$, $y \leq 1$, and $0 \leq x+y \leq 1$) having different compositions or different impurity contents are alternately stacked. For example, the current diffusion layer may have an n-type superlattice structure in which n-type GaN layers and/or $Al_xIn_yGa_zN$ layers (where $0 \leq x,y,z \leq 1$, and $x+y+z \neq 0$) each having a thickness of about 1 nm to about 500 nm are alternately stacked. An impurity concentration of the current diffusion layer may be in a range of $2 \times 10^{18}$ cm$^{-3}$ to $9 \times 10^{19}$ cm$^{-3}$.

The active layer 124 may be positioned between the first conductive semiconductor layer 122 and the second conductive semiconductor layer 126. The active layer 124 may discharge light having a certain energy by recombination of electrons and holes during driving of the semiconductor light-emitting device 100. The active layer 124 may have a multiple quantum well (MQW) structure in which quantum well layers and quantum barrier layers are alternately stacked. For example, each of the quantum well layers and each of the quantum barrier layers may include $In_xAl_yGa_{(1-x-y)}N$ layers (where $0 \leq x$, $y \leq 1$, and $0 \leq x+y \leq 1$) having different compositions. For example, the quantum well layer may include $In_xGa_{1-x}N$ (where $0 \leq x \leq 1$), and the quantum barrier layer may include GaN or AlGaN. Thicknesses of the quantum well layer and the quantum barrier layer may be in a range of about 1 nm to about 50 nm. The active layer 124 is not limited to having the MQW structure and may have a single quantum well structure.

The second conductive semiconductor layer 126 may include a nitride semiconductor layer having a composition of p-type $In_xAl_yGa_{(1-x-y)}N$ (where $0 \leq x<1$, $0 \leq y<1$, and $0 \leq x+y<1$). For example, p-type impurities may be magnesium (Mg).

In example embodiments, the second conductive semiconductor layer 126 may include an electron blocking layer (not shown), a low-concentration p-type GaN layer (not shown), and a high-concentration p-type GaN layer (not shown), which are stacked in a vertical direction. For example, the electron blocking layer may have a structure in which a plurality of $In_xAl_yGa_{(1-x-y)}N$ layers (where $0 \leq x$, $y \leq 1$, and $0 \leq x+y \leq 1$) having a thickness of about 5 nm to about 100 nm and having different compositions are alternately stacked, or may include a single layer including $Al_yGa_{(1-y)}N$ (where $0<y \leq 1$). An energy band gap of the electron blocking layer may be reduced as a distance from the active layer 124 increases. For example, aluminum (Al) content in the electron blocking layer may be reduced as the distance from the active layer 124 increases.

Each of the plurality of light-emitting structures 120 may be spaced apart from light-emitting structures 120 adjacent thereto with a device isolation region IA therebetween. A distance between the plurality of light-emitting structures 120 may be less than the first width w11 of each of the plurality of partition walls WSI, without being limited thereto.

The insulating liner 132 may be conformally positioned to cover an inner wall of the device isolation region IA and a side surface of each of the plurality of light-emitting structures 120. Also, the insulating liner 132 may be positioned on an inner wall of an opening E, which completely passes through the active layer 124 and the second conductive semiconductor layer 126. In example embodiments, the insulating liner 132 may include silicon oxide, silicon oxynitride, or silicon nitride. In some embodiments, the insulating liner 132 may have a structure in which a plurality of insulating layers are stacked.

The first contact 134A may be connected to the first conductive semiconductor layer 122 in the opening E penetrating the active layer 124 and the second conductive semiconductor layer 126. The second contact 134B may be positioned on the bottom surface of the second conductive semiconductor layer 126. The insulating liner 132 may electrically insulate the first contact 134A from the active layer 124 and the second conductive semiconductor layer 126. The insulating liner 132 may be positioned between the first contact 134A and the second contact 134B on the bottom surface of the second conductive semiconductor layer 126 and electrically insulate the first contact 134A from the second contact 134B. Each of the first contact 134A and the second contact 234B may include silver (Ag), aluminum (Al), nickel (Ni), chromium (Cr), gold (Au), platinum (Pt), palladium (Pd), tin (Sn), tungsten (W), rhodium (Rh), iridium (Ir), ruthenium (Ru), magnesium (Mg), zinc (Zn), titanium (Ti), copper (Cu), or any combination thereof. Each of the first contact 134A and the second contact 134B may include a metal material having high reflectivity.

A lower reflective layer 136 may be positioned on the insulating liner 132 positioned on the inner wall of the device isolation region IA. The lower reflective layer 136 may reflect light emitted from sidewalls of the plurality of light-emitting structures 120 and reflect the reflected light into the plurality of pixel spaces PXS.

In example embodiments, the lower reflective layer 136 may include Ag, Al, Ni, Cr, Au, Pt, Pd, Sn, W, Rh, Ir, Ru, Mg, Zn, Ti, Cu, or any combination thereof. The lower reflective layer 136 may include a metal material having high reflectivity. In other example embodiments, the lower reflective layer 136 may include a distributed Bragg reflector. For example, the distributed Bragg reflector may have a structure in which a plurality of insulating layers having different refractive indexes are repeatedly stacked. Each of the insulating layers in the distributed Bragg reflector may include oxide, nitride, or any combination thereof, for example, $SiO_2$, SiN, $SiO_xN_y$, $TiO_2$, $Si_3N_4$, $Al_2O_3$, TiN, AlN, $ZrO_2$, TiAlN, or TiSiN.

A wiring structure 140 may be arranged on the insulating liner 132, the first contact 134A, the second contact 134B, and the lower reflective layer 136. The wiring structure 140 may include a plurality of insulating layers 142 and a plurality of wiring layers 144. The plurality of wiring layers 144 may electrically connect each of the first contact 134A and the second contact 134B to the pad unit PAD. Some of the plurality of wiring layers 144 may be positioned on the inner wall of the device isolation region IA, and the plurality of insulating layers 142 may respectively cover the plurality of wiring layers 144 and fill the device isolation region IA. As shown in FIG. 3, the plurality of wiring layers 144 may include at least two writing layers 144 located at different levels in the vertical direction, but are not limited thereto. Each of the plurality of wiring layers 144 may include Ag, Al, Ni, Cr, Au, Pt, Pd, Sn, W, Rh, Ir, Ru, Mg, Zn, Ti, Cu, or any combination thereof.

In example embodiments, the plurality of light-emitting structures 120 included in one sub-array SA may be connected in series to each other. The plurality of wiring layers 144 may electrically connect the first contact 134A of one light-emitting structure 120 to the second contact 134B of another light-emitting structure 120 connected in series to the one light-emitting structure 120.

The pad unit PAD may be positioned in the pad region PDR and connected to the plurality of wiring layers 144. The pad unit PAD may be positioned at a lower level than the partition wall structure WS. In example embodiments, a sidewall and a bottom surface of the pad unit PAD may be covered by the plurality of insulating layers 142, and a top surface of the pad unit PAD may be positioned at a lower level than the top surfaces of the plurality of light-emitting structures 120. In other embodiments, unlike those shown in FIG. 3, some of the plurality of light-emitting structures 120 may be positioned in the pad region PDR, and the pad unit PAD may be positioned in openings (not shown) formed in the plurality of light-emitting structures 120. In this case, the top surface of the pad unit PAD may be positioned at the same level as the top surfaces of the plurality of light-emitting structures 120. Connection members (e.g., bonding wires) for electrical connection with a driver semiconductor chip (not shown) may be positioned on the pad unit PAD.

The partition wall structures WS may be positioned on the top surfaces of the plurality of light-emitting structures 120. The partition wall structures WS may include silicon (Si), silicon carbide (SiC), sapphire ($Al_2O_3$), or gallium nitride (GaN). In an example process, after the plurality of light-emitting structures 120 are formed on a substrate (refer to 110 in FIG. 18A), the partition wall structures WS may be formed by removing portions of the substrate 110. In this case, the partition wall structures WS may be portions of the substrate 110, which serve as a growth substrate for forming the light-emitting structures 120.

The plurality of partition walls WSI may be arranged in a matrix form in a plan view, and the plurality of pixel spaces PXS may be defined by the plurality of partition walls WSI. Each of the plurality of partition walls WSI may include a recess region RS, which is positioned at a bottom of each of the plurality of partition walls WSI to vertically overlap the device isolation region IA. The recess region RS may be formed by removing a portion of the substrate 110 during an etching process for separating a light-emitting stack (refer to 120L in FIG. 18A) into the plurality of light-emitting structures 120. The insulating liner 132 may be arranged to contact the recess region RS on a bottom surface of each of the plurality of partition walls WSI.

The top surfaces of the plurality of light-emitting structures 120 may be exposed at bottoms of the plurality of pixel spaces PXS. For example, a concave/convex portion 120P may be formed on the top surfaces of the plurality of light-emitting structures 120 positioned at the bottoms of the plurality of pixel spaces PXS. Light extraction efficiency of the plurality of light-emitting structures 120 may be improved by the concave/convex portion 120P, but the inventive concept is not limited thereto.

A passivation structure 150 may be positioned on a top surface WST and a sidewall WSS of each of the plurality of partition walls WSI. The passivation structure 150 may include a first passivation layer 152 and a second passivation layer 154, which are conformally positioned on the top surface WST and the sidewall WSS of each of the plurality of partition walls WSI. The passivation structure 150 may also be conformally positioned on the top surfaces of the light-emitting structures 120 (e.g., on the concave/convex portion 120P) positioned at the bottoms of the plurality of pixel spaces PXS.

In example embodiments, the first passivation layer 152 may include a first insulating material, and the second passivation layer 154 may include a second insulating material that is different from the first insulating material. Each of the first insulating material and the second insulating material may include at least one of silicon oxide, silicon nitride, silicon oxynitride, aluminum oxide, and aluminum nitride.

In example embodiments, the passivation structure 150 may include a first portion 150P1 positioned on the top surface WST of each of the plurality of partition walls WSI, a second portion 150P2 positioned on the sidewall WSS of each of the plurality of partition walls WSI, and a third portion 150P3 positioned on the top surfaces of the plurality of light-emitting structures 120. In some embodiments, a first thickness t11 of the first portion 150P1 may be less than or equal to a second thickness t12 of the second portion 150P2. Also, a third thickness t13 of the third portion 150P3 may be less than or equal to the second thickness t12 of the second portion 150P2. In some embodiments, the first thickness t11 of the first portion 150P1 may be about 0.1 μm to about 2 μm, and the second thickness t12 of the second portion 150P2 may be about 0.5 μm to 5 μm.

As shown in FIG. 4, portions of the first passivation layer 152 included in the first portion 150P1 (i.e., portions of the first passivation layer 152 on the top surfaces WST of the plurality of partition walls WS) may have a thickness less than a thickness of portions of the first passivation layer 152 included in the second portion 150P2 (i.e., portions of the first passivation layer 152 on the sidewalls WSS of the plurality of partition walls WS). Similarly, portions of the second passivation layer 154 included in the first portion 150P1 (i.e., portions of the second passivation layer 154 on the top surfaces WST of the plurality of partition walls WS) may have a thickness less than a thickness of portions of the second passivation layer 154 included in the second portion 150P2 (i.e., portions of the second passivation layer 154 on the sidewalls WSS of the plurality of partition walls WS).

In example embodiments, the first passivation layer 152 may have a relatively uniform thickness on the sidewall WSS of each of the plurality of partition walls WSI. Here, the expression "relatively uniform thickness" may mean that a minimum thickness of the first passivation layer 152 positioned on the sidewall WSS of each of the plurality of partition walls WSI is within about a certain percentage (e.g., 10%) of a maximum thickness thereof. Also, the second passivation layer 154 may have a relatively uniform thickness on the sidewall WSS of each of the plurality of partition walls WSI. In an example manufacturing process, the first and second passivation layers 152 and 154 may be formed using a material having excellent step coverage characteristics and/or using a manufacturing process (e.g., an atomic layer deposition (ALD) process), which is advantageous in forming materials having excellent step coverage characteristics.

For example, the first thickness t11 may be less than a critical thickness for the passivation structure 150 to act as a light guide. For example, when the first thickness t11 of the first portion 150P1 of the passivation structure 150 positioned on the top surface WSS of each of the plurality of partition walls WSI is greater than the critical thickness, light emitted from one pixel PX may be directed into an adjacent pixel PX through the first portion 150P1 of the passivation structure 150. Accordingly, when one pixel PX is turned on, light may be absorbed or penetrated into a pixel PX adjacent thereto, and thus, the adjacent pixel PX may be difficult to be put into a complete off state. The first thickness t11 of the first portion 150P1 may be less than or equal to the second thickness t12 of the second portion 150P2. Particularly, the first thickness t11 of the first portion 150P1 may be less than the critical thickness for the passivation structure 150 to act as the light guide. Accordingly, the second portion 150P2 of the passivation structure 150 may provide a sufficient thickness to prevent contamination of the fluorescent layer 160 and undesired light crosstalk between adjacent pixels PX due to the first portion 150P1 of the passivation structure 150 may be prevented.

Although not shown, a sidewall reflective layer (not shown) may be positioned on the sidewall WSS of each of the plurality of partition walls WSI. The sidewall reflective layer may include a material having a high reflectivity, such as a metal layer including Ag, Al, Ni, Cr, Au, Pt, Pd, Sn, W, Rh, Ir, Ru, Mg, Zn, or any combination thereof. The sidewall reflection layer may reflect light emitted from the plurality of light-emitting structures 120. A protective layer (not shown) may be further formed on the sidewall reflective layer.

The fluorescent layer 160 may be positioned inside the plurality of pixel spaces PXS on the top surfaces of the plurality of light-emitting structures 120. As shown in FIG. 3, the fluorescent layer 160 may fill substantially the total space of the plurality of pixel spaces PXS on the passivation structure 150. A top surface of the fluorescent layer 160 may be at the same level as the top surface WST of each of the plurality of partition walls WSI, but the inventive concept is not limited thereto.

The fluorescent layer 160 may include a single material capable of converting the color of light emitted from the light-emitting structure 120 into a desired color. That is, a fluorescent layer 160 associated with the same color may be positioned in the plurality of pixel spaces PXS. However, the inventive concept is not limited thereto. The color of the fluorescent layer 160 positioned in some of the plurality of pixel spaces PXS may be different from the color of a fluorescent layer 160 positioned in the remaining pixel spaces PXS.

The fluorescent layer 160 may include a resin containing a fluorescent material dispersed therein or a film containing a fluorescent material. For example, the fluorescent layer 160 may include a fluorescent material film in which fluorescent material particles are uniformly dispersed at a certain concentration. The fluorescent material particles may be a wavelength conversion material that changes the wavelength of light emitted from the plurality of light-emitting structures 120. The fluorescent layer 160 may include at least two kinds of fluorescent material particles having different size distributions to improve the density and color uniformity of the fluorescent material particles.

In example embodiments, the fluorescent material may have various colors and various compositions such as an oxide-based composition, a silicate-based composition, a nitride-based composition, and a fluoride-based composition. For example, $\beta$-SiAlON:Eu$^{2+}$(green), (Ca,Sr)AlSiN$_3$:Eu$^{2+}$(red), La$_3$Si$_6$N$_{11}$:Ce$^{3+}$(yellow), K$_2$SiF$_6$:Mn$_4^+$(red), SrLiAl$_3$N$_4$:Eu(red), Ln$_{4-x}$(EU$_z$M$_{1-z}$)$_x$Si$_{12-y}$Al$_y$O$_{3+x+y}$N$_{18-x-y}$ (0.5≤x≤3, 0<z<0.3, 0<y≤4)(red), K$_2$TiF$_6$:Mn$_4^+$(red), NaYF$_4$:Mn$_4^+$(red), NaGdF$_4$:Mn$_4^+$(red), and the like may be used as the fluorescent material. However, the kind of the fluorescent material is not limited thereto.

In other embodiments, a wavelength conversion material, such as a quantum dot, may be further positioned over the fluorescent layer 160. The quantum dot may have a core-shell structure using a III-V or II-VI compound semiconductor. For example, the quantum dot may have a core such as CdSe and InP and a shell such as ZnS and ZnSe. In addition, the quantum dot may include a ligand for stabilizing the core and the shell.

A support substrate 170 may be positioned on the wiring structure 140, and an adhesive layer 172 may be positioned between the support substrate 170 and the wiring structure 140. In example embodiments, the adhesive layer 172 may include an electrically insulating material, for example, silicon oxide, silicon nitride, a polymer material such as a UV-curable material, or resin. In some embodiments, the adhesive layer 172 may include a eutectic adhesive material, such as AuSn or NiSi. The support substrate 170 may include a sapphire substrate, a glass substrate, a transparent conductive substrate, a silicon substrate, or a silicon carbide substrate, but is not limited thereto.

In general, a light source module including a plurality of light-emitting device chips may be used for an intelligent lighting system (e.g., a head lamp for a vehicle), and each of the light-emitting device chips may be individually controlled to implement various lighting modes depending on surrounding conditions. When a plurality of light-emitting devices arranged in a matrix form are used, light emitted from each of the plurality of light-emitting devices may be absorbed or penetrated into a light-emitting device adjacent thereto, and contrast characteristics of the light source module may be degraded. However, according to example embodiments, by forming the partition wall structures WS on the plurality of light-emitting structures 120, the absorption or penetration of light emitted from one pixel PX into an adjacent pixel PX may be reduced or prevented.

Additionally, during a process of forming a passivation layer covering the partition wall structure WS, a thickness of a portion of the passivation layer, which is formed on the top surface of the partition wall structure WS, may be greater than a thickness of a portion of the passivation layer, which is formed on a sidewall of the partition wall structure WS. In this case, the portion of the passivation layer, which is formed on the top surface of the partition wall structure WS, may act as a light guide, and thus, light emitted from one pixel PX may be adsorbed or penetrated into an adjacent pixel PX. However, according to example embodiments, the first portion 150P1 of the passivation structure 150 may be formed to a thickness less than or equal to a thickness of the second portion 150P2 thereof. Thus, the absorption or penetration of light emitted from one pixel PX into an adjacent pixel PX through the first portion 150P1 of the passivation structure 150 may be prevented or reduced. Accordingly, contrast characteristics of the semiconductor light-emitting device 100 may be excellent.

In addition, the fluorescent layer 160 may be firmly fixed in each of the pixel spaces PXS by the partition wall structure WS. Even when repetitive vibration and impact are applied to the semiconductor light-emitting device 100 such as in the case in which the semiconductor light-emitting device 100 is used as a headlamp for a vehicle, the reliability of the semiconductor light-emitting device 100 may be improved.

FIGS. 5 to 11 are cross-sectional views of semiconductor light-emitting devices according to example embodiments. FIGS. 5 to 11 are enlarged cross-sectional views corresponding to a cross-section of the portion CX2 of FIG. 3. In FIGS. 5 to 11, the same reference numerals are used to denote the same elements as in FIGS. 1 to 4.

Figure 5:
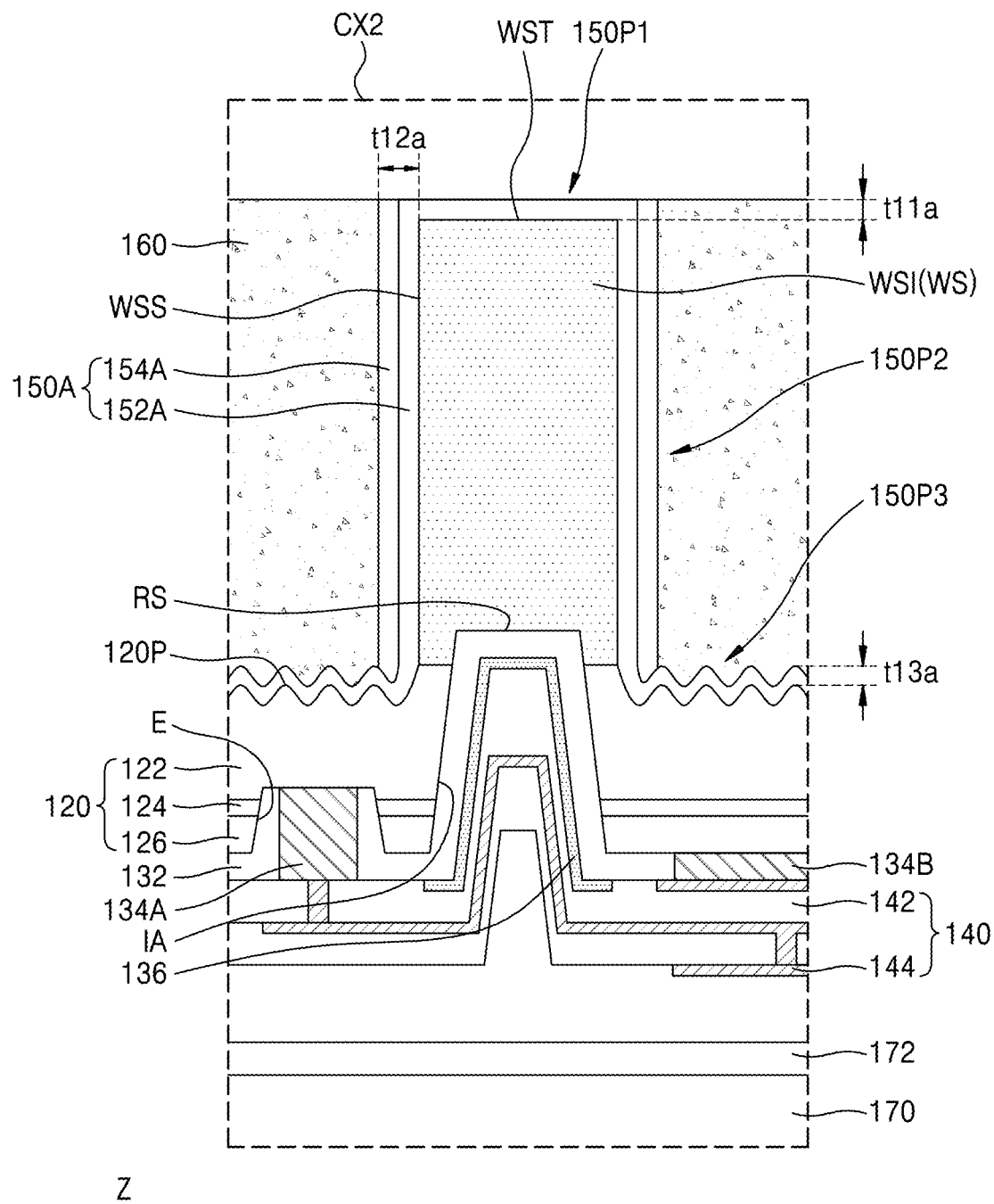
FIG. 5 is a cross-sectional view of a semiconductor light-emitting device according to example embodiments.

FIG. 5 is a cross-sectional view of a semiconductor light-emitting device 100A according to example embodiments.

Referring to FIG. 5, a passivation structure 150A may include a first passivation layer 152A and a second passivation layer 154A. The first passivation layer 152A may be conformally positioned on a top surface WST and a sidewall WSS of each of a plurality of partition walls WSI. The second passivation layer 154A may cover the first passivation layer 152A on the sidewall WSS of each of the plurality of partition walls WSI. The second passivation layer 154A may not be positioned on the top surface WST of each of the plurality of partition walls WSI.

The passivation structure 150A may include a first portion 150P1 positioned on the top surface WST of each of the plurality of partition walls WSI, a second portion 150P2 positioned on the sidewall WSS of each of the plurality of partition walls WSI, and a third portion 150P3 arranged on the top surfaces of the light-emitting structures 120. The first portion 150P1 and the third portion 150P3 may include a single layer of the first passivation layer 152A, and the second portion 150P2 may have a double structure of the first passivation layer 152A and the second passivation layer 154A. A first thickness t11a of the first portion 150P1 may be less than or equal to a second thickness t12a of the second portion 150P2, and a third thickness t13a of the third portion 150P3 may be less than or equal to the second thickness t12a of the second portion 150P2.

As shown in FIG. 5, a portion of the first passivation layer 152A included in the first portion 150P1 may have a thickness equal or similar to a thickness of a portion of the first passivation layer 152A included in the second portion 150P2. For example, the first passivation layer 152A may be formed to have a relatively uniform thickness in the first portion 150P1, the second portion 150P2, and the third portion 150P3, without being limited thereto.

In an example manufacturing process, the first passivation layer 152A may be conformally formed on the top surface WST and the sidewall WSS of each of the plurality of partition walls WSI and the top surfaces of the light-emitting structures 120. Subsequently, the second passivation layer 154A may be formed on the first passivation layer 152A. Thereafter, an anisotropic etching process may be performed on the second passivation layer 154A. Thus, portions of the second passivation layer 154A, which are positioned on the top surfaces WST of the plurality of partition walls WSI and the top surfaces of the light-emitting structures 120, may be removed, while only portions of the second passivation layer 154A, which are positioned on the sidewalls WSS of the plurality of partition walls WSI, may remain. As a result, the first portion 150P1 of the passivation structure 150A may have a thickness less than a critical thickness at which the first portion 150P1 of the passivation structure 150A may act as a light guide.

Although not shown, a sidewall reflective layer (not shown) may be positioned on the sidewall WSS of each of the plurality of partition walls WSI, and a protective layer (not shown) may be further formed on the sidewall reflective layer.

According to the example embodiments described above, the absorption or penetration of light emitted from one pixel PX into an adjacent pixel PX through the first portion 150P1 of the passivation structure 150A may be reduced or prevented, and contrast characteristics of the semiconductor light-emitting device 100A may be excellent.

Figure 6:
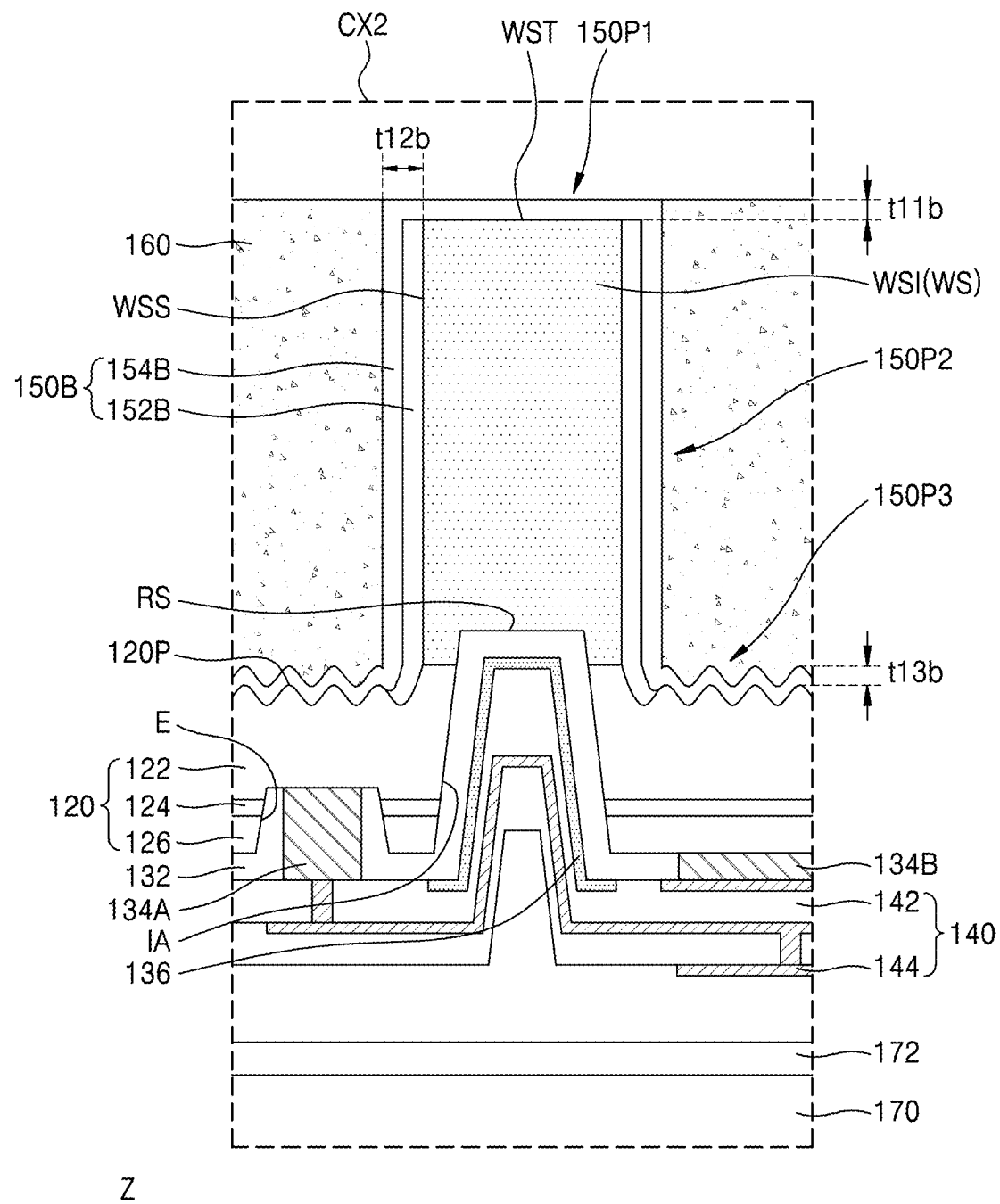
FIG. 6 is a cross-sectional view of a semiconductor light-emitting device according to example embodiments.

FIG. 6 is a cross-sectional view of a semiconductor light-emitting device 100B according to example embodiments.

Referring to FIG. 6, a passivation structure 150B may include a first passivation layer 152B and a second passivation layer 154B. The first passivation layer 152B may be positioned on a sidewall WSS of each of a plurality of partition walls WSI. The second passivation layer 154B may be conformally positioned on a top surface WST and the sidewall WSS of each of the plurality of partition walls WSI while covering the first passivation layer 152B. The first passivation layer 152B may not be positioned on the top surface WST of each of the plurality of partition walls WSI, and the top surface WST of each of the plurality of partition walls WSI may be in contact with the second passivation layer 154B.

A first thickness t11b of a first portion 150P1 of the passivation structure 150B may be less than or equal to a second thickness t12b of a second portion 150P2 thereof. A third thickness t13b of a third portion 150P3 of the passivation structure 150B may be less than or equal to the second thickness t12b of the second portion 150P2 thereof.

As shown in FIG. 6, a portion of the second passivation layer 154B included in the first portion 150P1 may have a thickness equal or similar to a thickness of a portion of the second passivation layer 154B included in the second portion 150P2. For example, the second passivation layer 154B may be formed to a relatively uniform thickness in the first portion 150P1, the second portion 150P2, and the third portion 150P3, without being limited thereto.

In an example manufacturing process, the first passivation layer 152B may be conformally formed on the top surfaces WST and the sidewalls WSS of the plurality of partition walls WSI and a top surface of a light-emitting structure 120.

Thereafter, an anisotropic etching process may be performed on the first passivation layer 152B. Thus, portions of the first passivation layer 152B, which are positioned on the top surfaces WST of the plurality of partition walls WSI and the top surface of the light-emitting structure 120, may be removed, while only portions of the first passivation layer 152B, which are positioned on the sidewalls WSS of the plurality of partition walls WSI, may remain. Subsequently, the second passivation layer 154B may be formed on the top surfaces WST and the sidewalls WSS of the plurality of partition walls WSI and the top surface of the light-emitting structure 120 to cover the first passivation layer 152B. Accordingly, the first portion 150P1 of the passivation structure 150B may have a thickness less than a critical thickness at which the first portion 150P1 of the passivation structure 150B may act as a light guide.

Although not shown, a sidewall reflective layer (not shown) may be positioned on the sidewall WSS of each of the plurality of partition walls WSI, and a protective layer (not shown) may be further formed on the sidewall reflective layer.

According to the example embodiments described above, the absorption or penetration of light emitted from one pixel PX into an adjacent pixel PX through the first portion 150P1 of the passivation structure 150B may be reduced or prevented, and contrast characteristics of the semiconductor light-emitting device 100B may be excellent.

Figure 7:
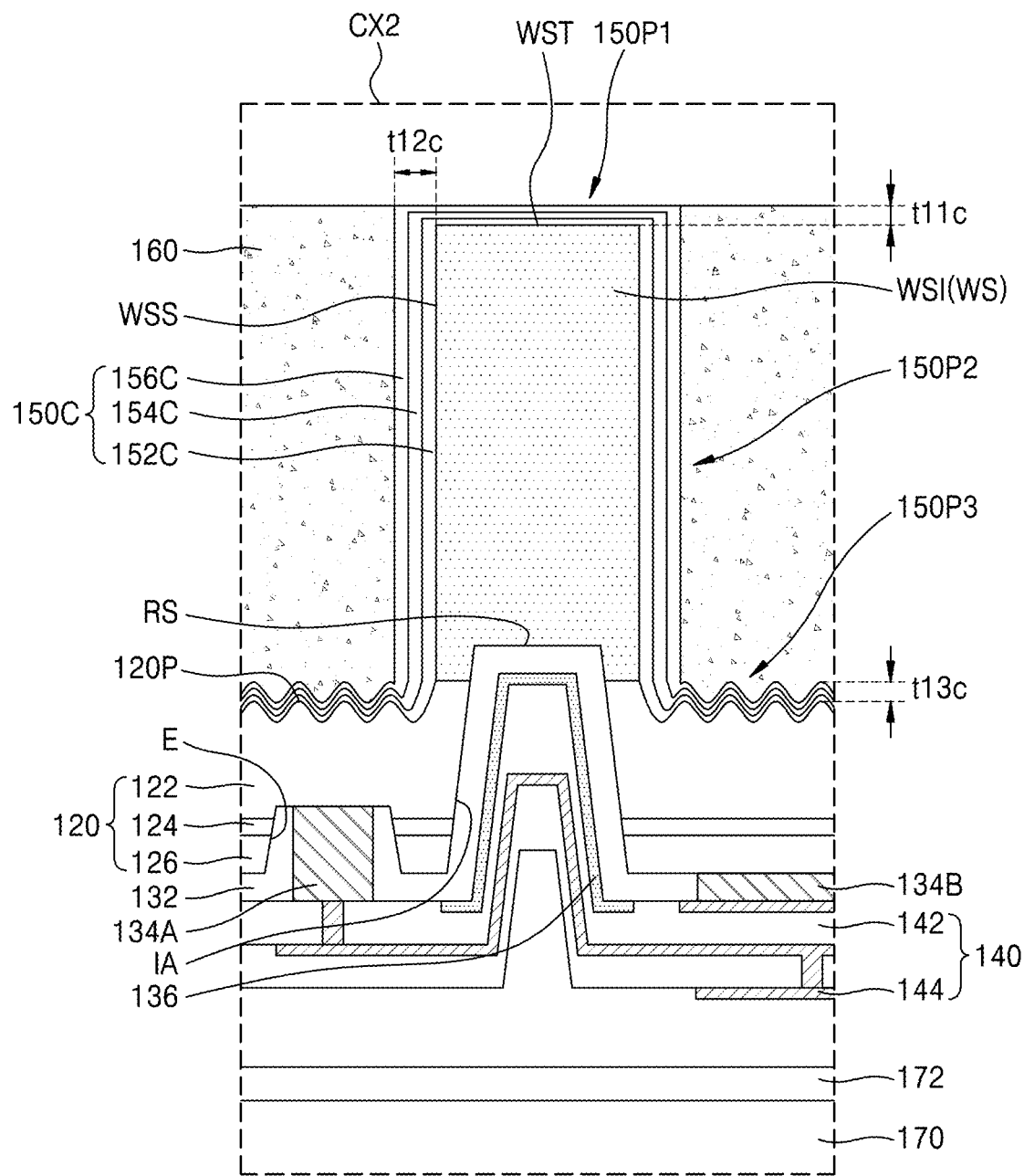
FIG. 7 is a cross-sectional view of a semiconductor light-emitting device according to example embodiments.

FIG. 7 is a cross-sectional view of a semiconductor light-emitting device 100C according to example embodiments.

Referring to FIG. 7, a passivation structure 150C may include a first passivation layer 152C, a second passivation layer 154C, and a third passivation layer 156C.

In example embodiments, the third passivation layer 156C may include a third insulating material, which includes at least one of silicon oxide, silicon nitride, silicon oxynitride, aluminum oxide, and aluminum nitride. In example embodiments, the third insulating material included in the third passivation layer 156C may be different from a second insulating material included in the second passivation layer 154C and may be the same as a first insulating material included in the first passivation layer 152C, without being limited thereto. For example, the passivation structure 150C may have a stack structure of $SiO_2/Al_2O_3/SiO_2$, $SiON/Al_2O_3/SiON$, $SiN_x/Al_2O_3/SiN_x$, $Al_2O_3/SiO_2/Al_2O_3$, $Al_2O_3/SiON/Al_2O_3$, $Al_2O_3/SiN_x/Al_2O_3$, $SiO_2/AlN/SiO_2$, $SiON/AlN/SiON$, $SiN_x/AlN/SiN_x$, $SiO_2/SiN_x/SiO_2$, and/or $Al_2O_3/AlN/Al_2O_3$.

A first thickness t11c of a first portion 150P1 of the passivation structure 150C may be less than a second thickness t12c of a second portion 150P2, and a third thickness t13c of a third portion 150P3 may be less than or equal to the second thickness t12c of the second portion 150P2. As shown in FIG. 7, a thickness of each of the first passivation layer 152C, the second passivation layer 154C, and the third passivation layer 156C included in the first portion 150P1 may be less than a thickness of each of the first passivation layer 152C, the second passivation layer 154C, and the third passivation layer 156C included in the second portion 150P2. In other embodiments, unlike that shown in FIG. 7, at least one of the first passivation layer 152C, the second passivation layer 154C, and the third passivation layer 156C may be included only in the second portion 150P2 but not in the first portion 150P1.

In other embodiments, the passivation structure 150C may have a stack structure in which the passivation layer 152C and the second passivation layer 154C, which are provided as a pair of passivation layers, are alternately stacked plural times. For example, when the passivation structure 150C has a stack structure in which the first and second passivation layers 152C and 154C, which are provided as the pair of passivation layers, are alternately stacked twice, the second portion 150P2 of the passivation structure 150C may have a stack structure of $SiO_2/Al_2O_3/SiO_2/Al_2O_3$, $Si ON/Al_2O_3/SiON/Al_2O_3$, $SiN_x/Al_2O_3/SiN_x/Al_2O_3$, $Al_2O_3/SiO_2/Al_2O_3/SiO_2$, $Al_2O_3/SiON/Al_2O_3/SiON$, $Al_2O_3/SiN_x/Al_2O_3/SiN_x$, $SiO_2/AlN/SiO_2/AlN$, $SiON/AlN/SiON/AlN$, $SiN_x/AlN/SiN_x/AlN$, $SiO_2/SiN_x/SiO_2/SiN_x$, or $Al_2O_3/AlN/Al_2O_3/AlN$.

In example embodiments, the passivation structure 150C may have a stack structure in which the first and second passivation layers 152C and 154C, which are provided as the pair of passivation layers, are alternately stacked twice to 10 times, each of the first and second passivation layers 152C and 154C may have a thickness of about 10 nm to about 300 nm, and the first thickness t11c of the first portion 150P1 of the passivation structure 150C may be about 0.1 μm to about 2 μm.

Although not shown, a sidewall reflective layer (not shown) may be positioned on the sidewall WSS of each of the plurality of partition walls WSI, and a protective layer (not shown) may be further formed on the sidewall reflective layer.

According to the example embodiments described above, the absorption or penetration of light emitted from one pixel PX into an adjacent pixel PX through the first portion 150P1 of the passivation structure 150C may be reduced or prevented, and contrast characteristics of the semiconductor light-emitting device 100C may be excellent.

Figure 8:
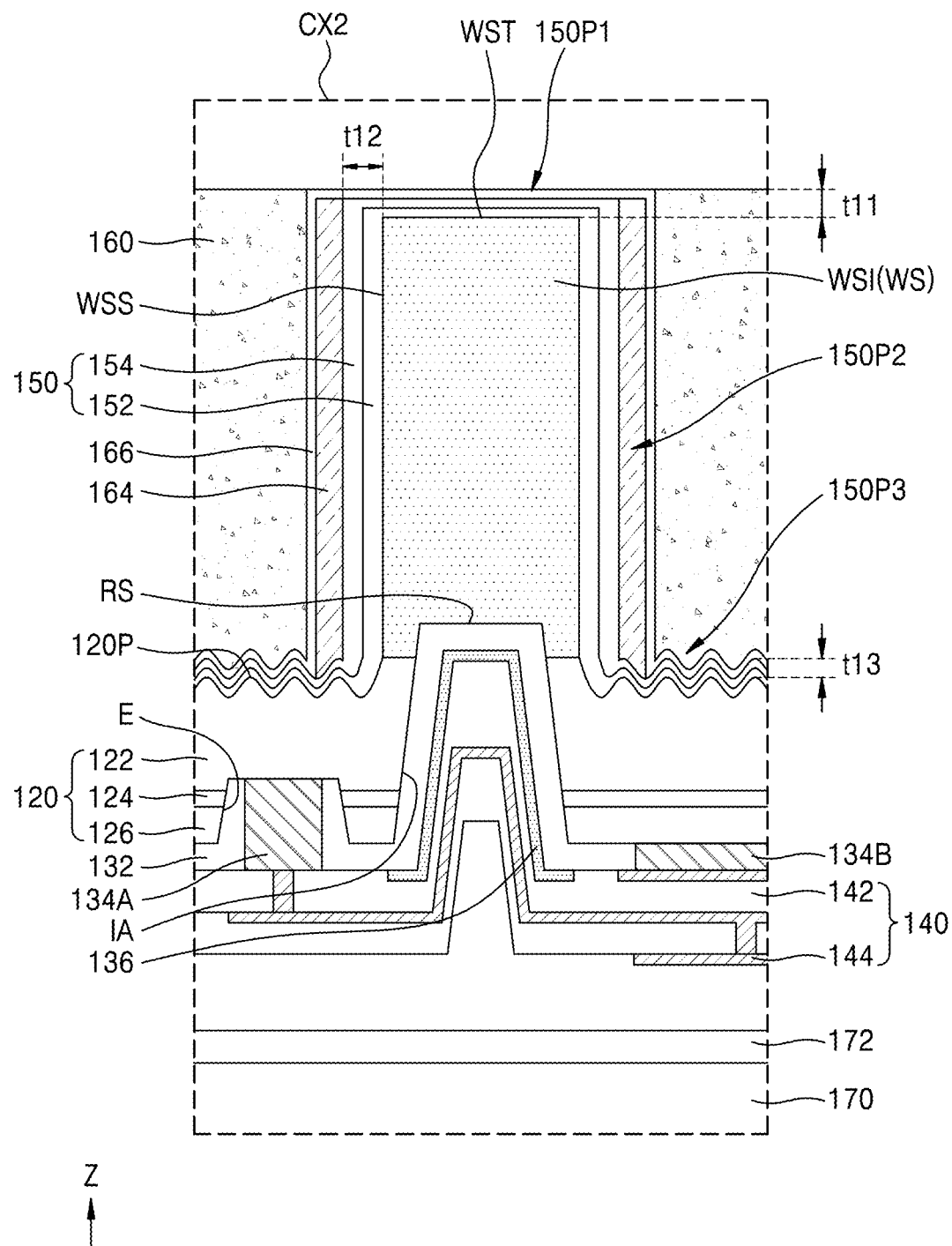
FIG. 8 is a cross-sectional view of a semiconductor light-emitting device according to example embodiments.

FIG. 8 is a cross-sectional view of a semiconductor light-emitting device 100D according to example embodiments.

Referring to FIG. 8, a sidewall reflective layer 164 may be positioned on the sidewall WSS of each of the plurality of partition walls WSI. The sidewall reflective layer 164 may reflect light emitted by a plurality of light-emitting structures 120. A protective layer 166 may be further formed on the sidewall reflective layer 164.

In example embodiments, the sidewall reflective layer 164 may include a metal layer, which includes Ag, Al, Ni, Cr, Au, Pt, Pd, Sn, W, Rh, Ir, Ru, Mg, Zn, or any combination thereof In other embodiments, the sidewall reflective layer 164 may include a resin layer (e.g., a polyphthalamide (PPA) layer) containing a metal oxide, such as titanium oxide or aluminum oxide. In other embodiments, the sidewall reflective layer 164 may be a distributed Bragg reflector layer. For example, the distributed Bragg reflector layer may have a structure in which a plurality of insulating films having different refractive indexes are repeatedly stacked several to several hundred times. Each of the insulating films in the distributed Bragg reflector layer may include oxide, nitride, or any combination thereof, for example, $SiO_2$, $SiN$, $SiO_xN_y$, $TiO_2$, $Si_3N_4$, $Al_2O_3$, $TiN$, $AlN$, $ZrO_2$, $TiAlN$, or $TiSiN$. The protective layer 166 may include at least one of silicon oxide, silicon nitride, silicon oxynitride, aluminum oxide, and aluminum nitride.

Figure 9:
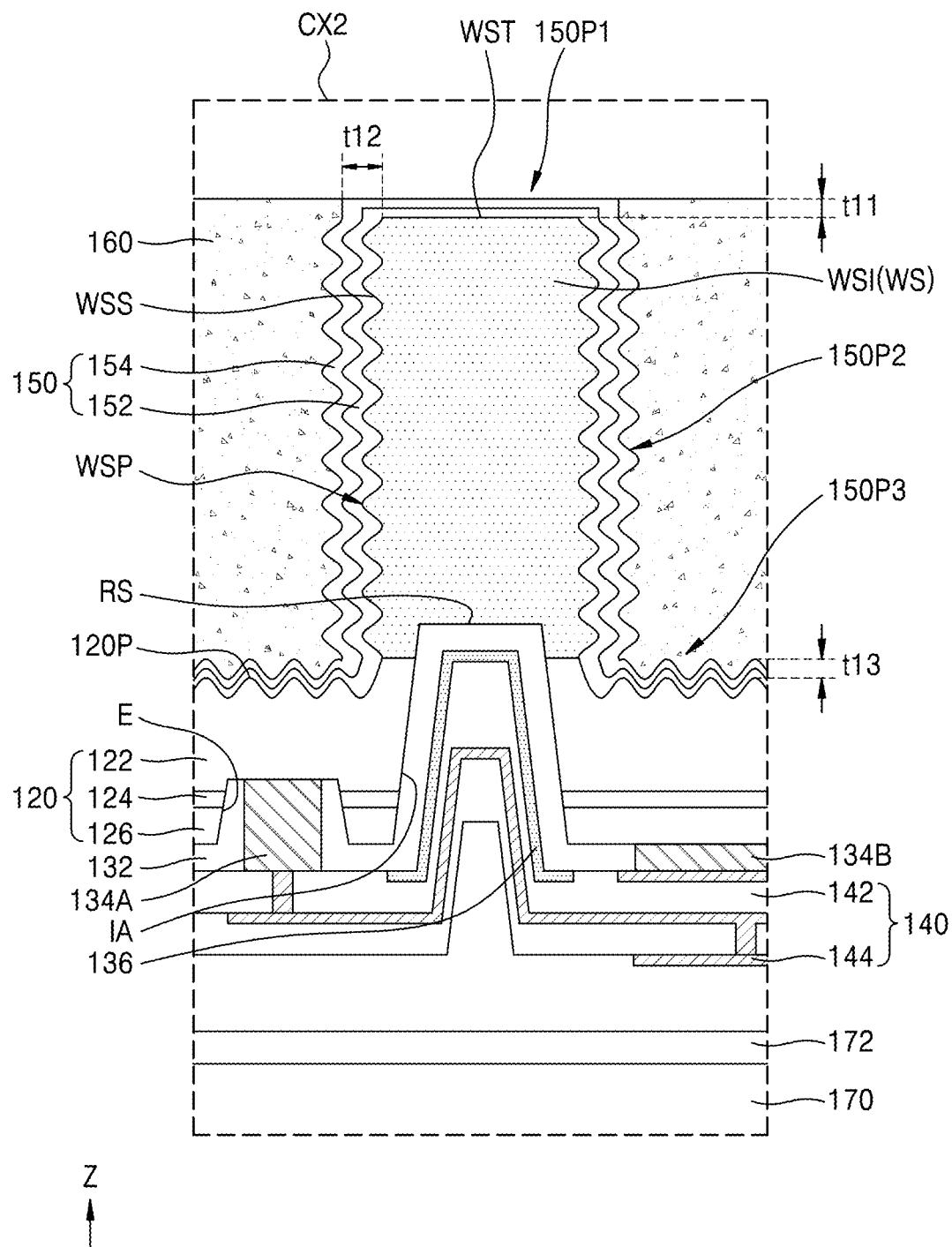
FIG. 9 is a cross-sectional view of a semiconductor light-emitting device according to example embodiments.

FIG. 9 is a cross-sectional view of a semiconductor light-emitting device 100E according to example embodiments.

Referring to FIG. 9, a sidewall WSS of each of a plurality of partition walls WSI may include protrusions WSP. For example, the protrusions WSP may be arranged a predetermined distance from each other in at least a portion of the sidewall WSS of each of the plurality of partition walls WSI.

A passivation structure 150 may also be conformally formed along shapes of the protrusions WSP. A sidewall of a fluorescent layer 160 filling a plurality of pixel spaces PXS may include concave portions (not shown) corresponding to the shapes of the protrusions WSP. Since each of the plurality of partition walls WSI includes the protrusions WSP, a contact area between each of the plurality of partition walls WSI and the fluorescent layer 160, which face each other, may further increase and the fluorescent layer 160 may be firmly fixed to a partition wall structure WS.

According to example embodiments, a light-emitting structure 120L may be formed on a substrate (refer to 110 in FIG. 18A), and a portion of the substrate 110 may be then etched to form the partition wall structure WS. Depending on etching conditions used in the process of etching the substrate 110, the protrusions WSP may be formed on a sidewall of the partition wall structure WS.

Although not shown, a sidewall reflective layer (not shown) may be positioned on the sidewall WSS of each of the plurality of partition walls WSI, and a protective layer (not shown) may be further formed on the sidewall reflective layer.

Figure 10:
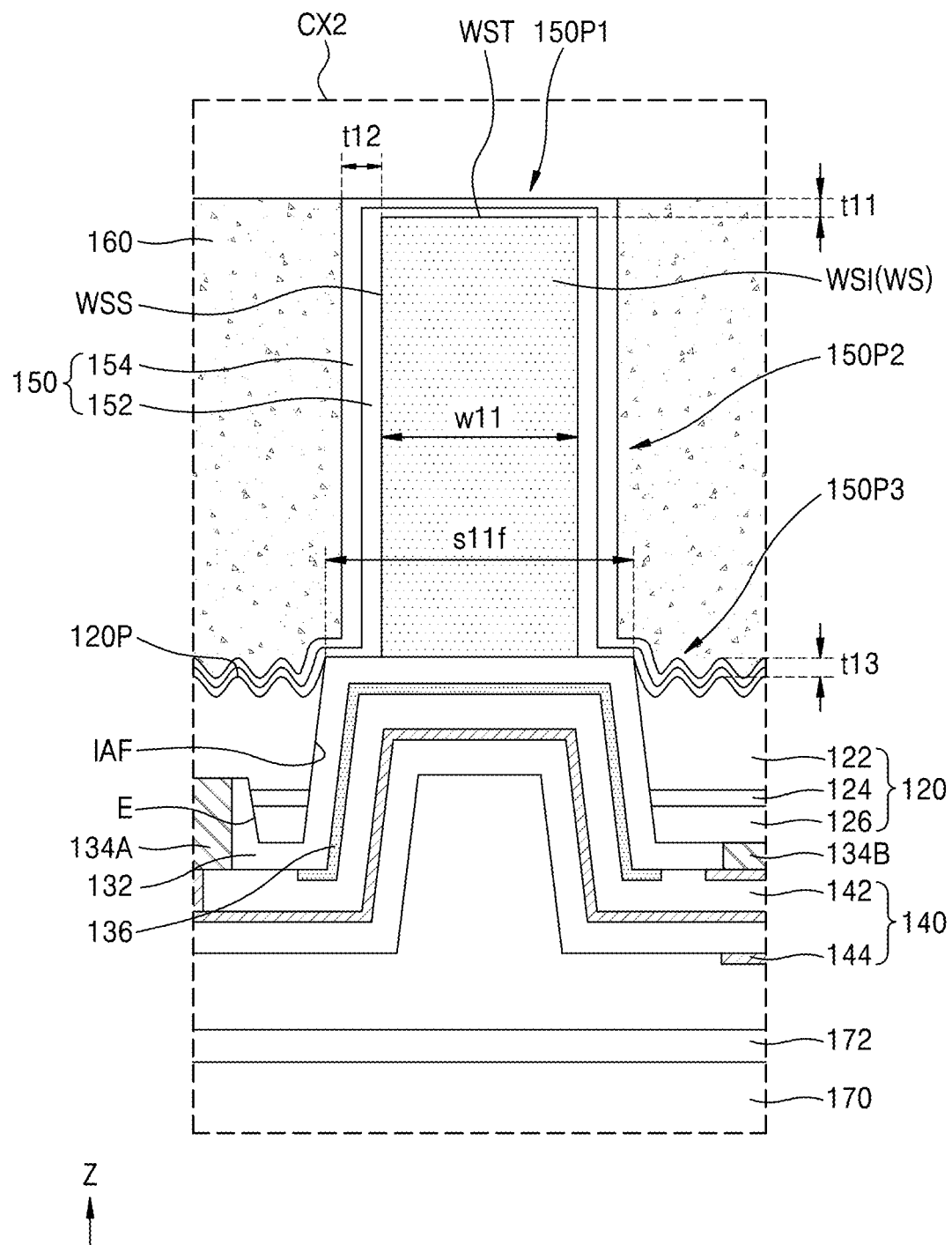
FIG. 10 is a cross-sectional view of a semiconductor light-emitting device according to example embodiments.

FIG. 10 is a cross-sectional view of a semiconductor light-emitting device 100F according to example embodiments.

Referring to FIG. 10, a plurality of light-emitting structures 120 may be arranged a distance s11$f$ from each other not to vertically overlap a plurality of partition walls WSI. Here, the distance s11$f$ may be a relatively great distance. For example, the distance s11$f$ between the plurality of light-emitting structures 120 may be greater than a first width w11 of each of the plurality of partition walls WSI. Since a device isolation region IAF is formed to a width greater than the first width w11 of each of the plurality of partition walls WSI, a bottom surface of each of the plurality of partition walls WSI may not include a recess region (refer to RS in FIG. 4) but may be relatively planar.

A lower reflective layer 136 may be conformally positioned under the plurality of partition walls WSI and on an inner wall of the device isolation region IAF. Thus, the lower reflective layer 136 may reflect light emitted through spaces between the plurality of partition walls WSI and the plurality of light-emitting structures 120 or through sidewalls of the plurality of light-emitting structures 120 and redirect the reflected light into a plurality of pixel spaces PXS.

Figure 11:
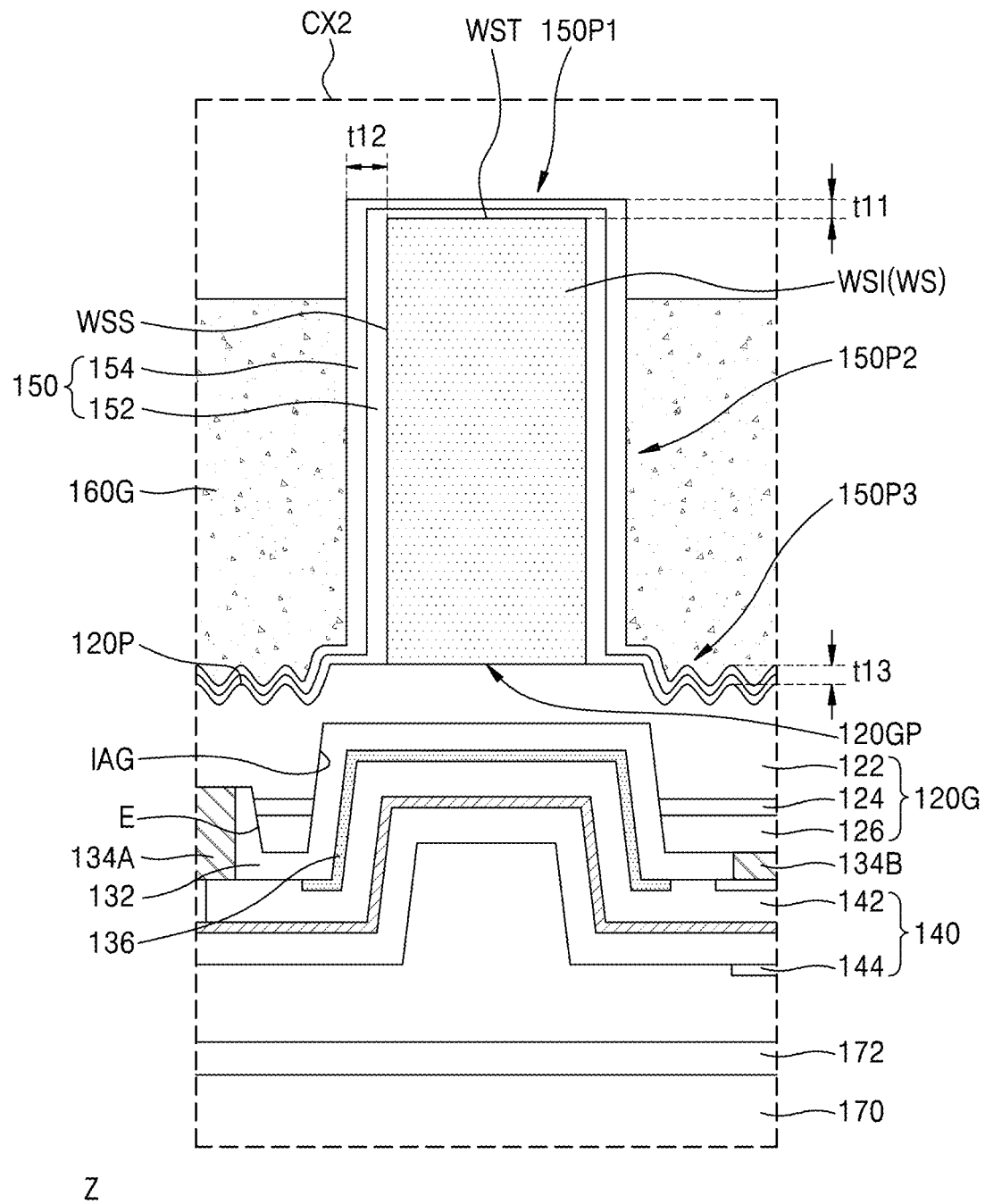
FIG. 11 is a cross-sectional view of a semiconductor light-emitting device according to example embodiments.

FIG. 11 is a cross-sectional view of a semiconductor light-emitting device 100G according to example embodiments.

Referring to FIG. 11, a connection 120GP configured to connect adjacent light-emitting structures 120 to each other may be positioned in a device isolation region IAG. The connection 120GP may be positioned at a lower level than each of a plurality of partition walls WSI, and the device isolation region IAG may be formed to a greater width than each of the plurality of partition walls WSI, and thus, the absorption or penetration of light emitted from one pixel PX into an adjacent pixel PX may be reduced or prevented. The connection 120GP may be a portion of a light-emitting stack (refer to 120L in FIG. 18A), which remains when the device isolation region IAG is formed to partially pass through the light-emitting stack 120L during an etching process for separating the light-emitting stack 120L into a plurality of light-emitting structures 120. For example, the connection 120GP may be a portion of a first conductive semiconductor layer 122.

A fluorescent layer 160G may have a top surface positioned at a lower level than the plurality of partition walls WSI. For example, a height difference between the top surface of the fluorescent layer 160G and top surfaces of the plurality of partition walls WSI may be about 0.1 µm to about 50 µm.

Although not shown, a sidewall reflective layer (not shown) may be positioned on a sidewall WSS of each of the plurality of partition walls WSI, and a protective layer (not shown) may be further formed on the sidewall reflective layer.

Figure 12:
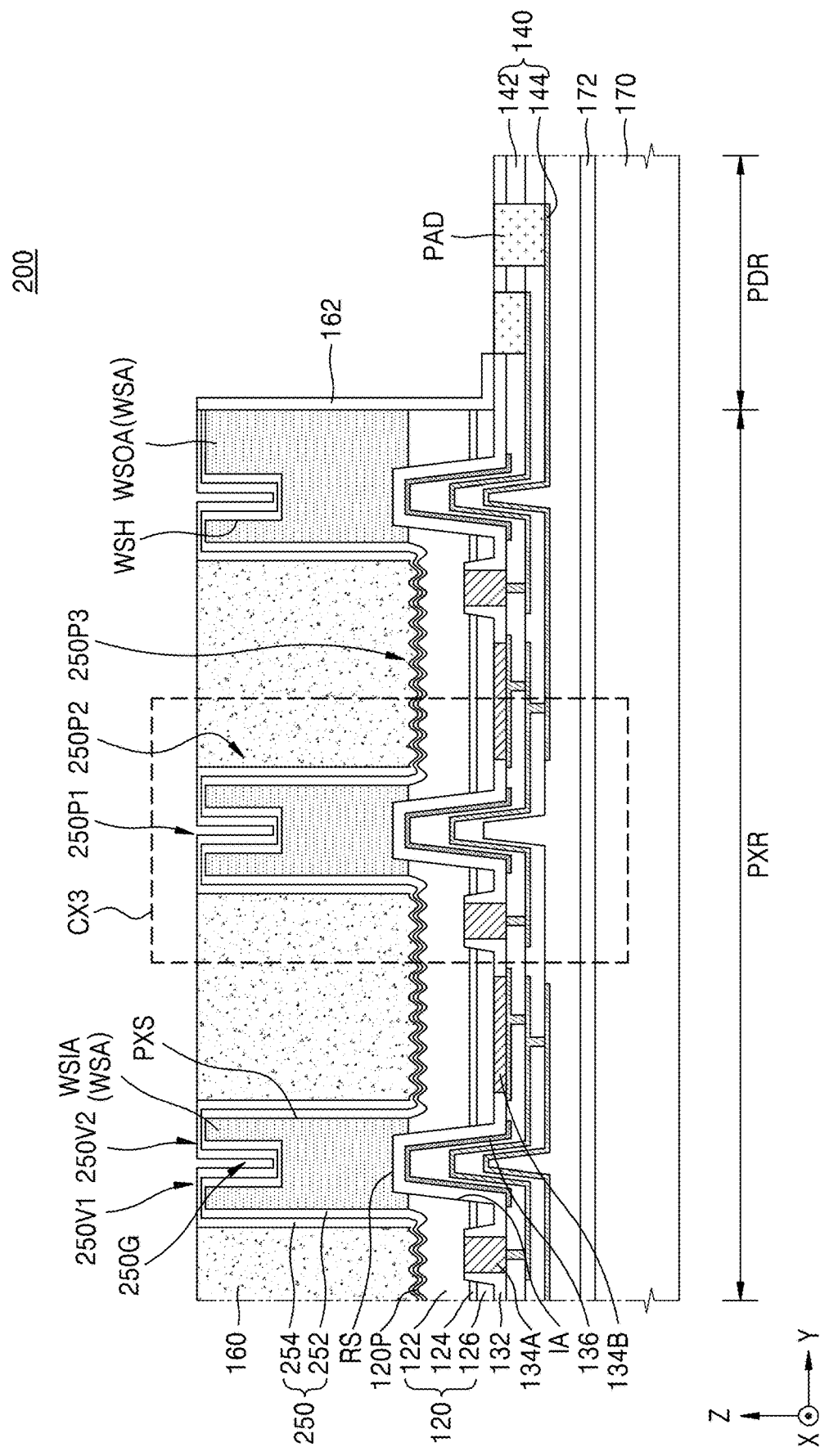
FIG. 12 is a cross-sectional view of a semiconductor light-emitting device according to example embodiments.
Figure 13:
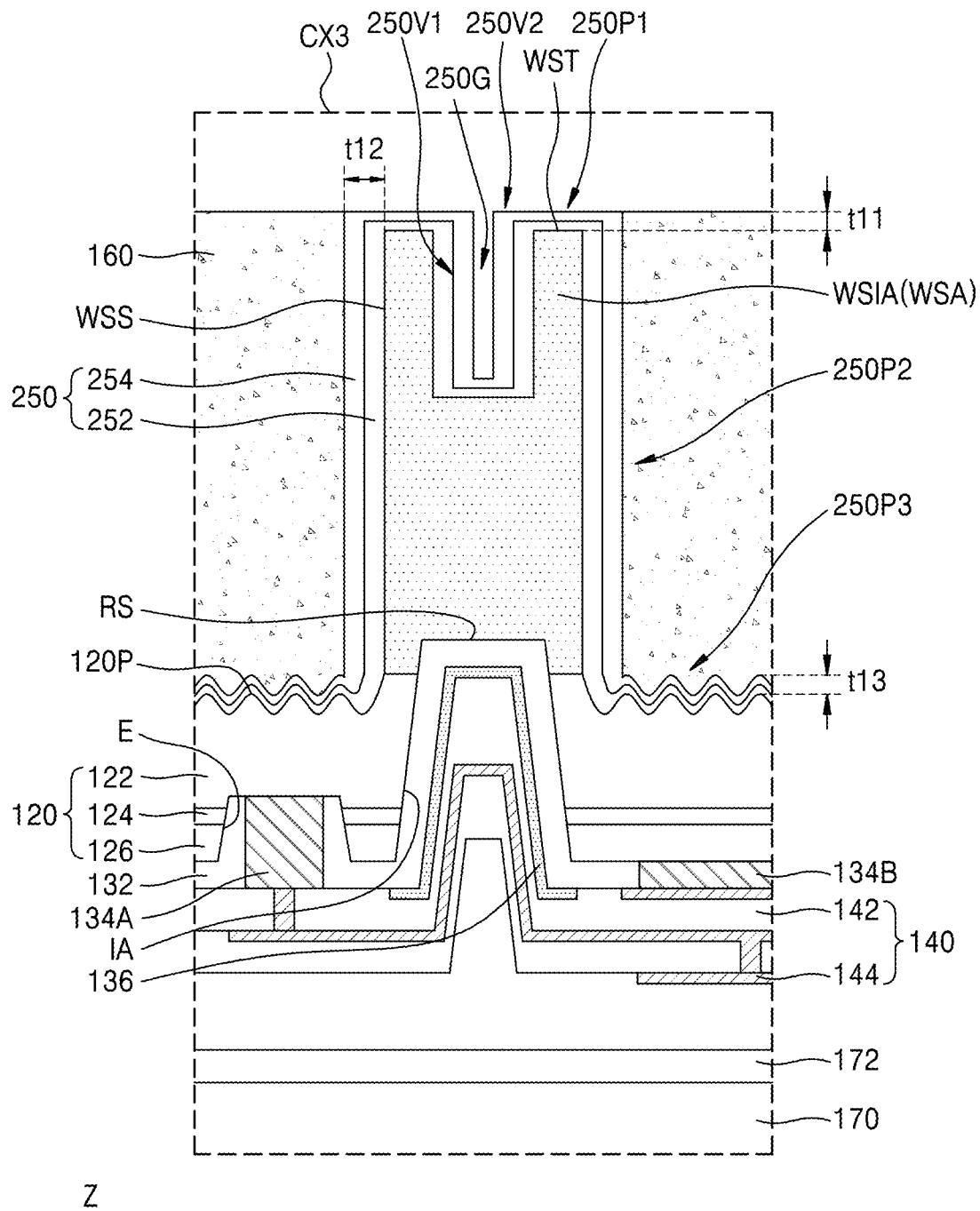
FIG. 13 is an enlarged view of a portion CX3 of FIG. 12.

FIG. 12 is a cross-sectional view of a semiconductor light-emitting device 200 according to example embodiments. FIG. 13 is an enlarged view of a portion CX3 of FIG. 12.

Referring to FIGS. 12 and 13, a partition wall structure WSA may include a plurality of partition walls WSIA and an outer partition wall WSOA. A trench WSH may be provided in each of upper portions of the plurality of partition walls WSIA and the outer partition wall WSOA. The trench WSH may have a depth of about 1 µm to about 25 µm and extend in a vertical direction.

A passivation structure 250 may include a first portion 250P1 positioned on the top surface WST of each of the plurality of partition walls WSIA, a second portion 250P2 positioned on the sidewall WSS of each of the plurality of partition walls WSIA, and a third portion 250P3 arranged on the top surfaces of the light-emitting structures 120 (or between the plurality of light-emitting structures 120 and the fluorescent layer 160). The passivation structure 250 may further include a first vertical extension portion 250V1 and a second vertical extension portion 250V2, which are positioned on both sidewalls of the trench WSH.

The first vertical extension portion 250V1 and the second vertical extension portion 250V2 may be spaced apart from each other with a gap 250G therebetween. Although the inside of the gap 250G is illustrated as an empty space in FIG. 13, in some embodiments, a sidewall reflective layer (refer to 164 in FIG. 8) may be positioned on the sidewall WSS of each of the plurality of partition walls WSIA or inside the gap 250G. A protective layer (refer to 166 in FIG. 8) may be further formed on the sidewall reflective layer 164.

The passivation structure 250 may include a first passivation layer 252 and a second passivation layer 254, which may be conformally positioned on a sidewall and a bottom of the trench WSH. The first passivation layer 252 and the second passivation layer 254 may be conformally positioned on the first portion 250P1, on the second portion 250P2, and the third portion 250P3. The first and second passivation layers 252 and 254 may be easily understood in detail with reference to the descriptions of the first and second passivation layers 152 and 154 provided with reference to FIGS. 2 to 4.

The gap 250G may act as a shield to block a light guide path between two adjacent pixels PX. For example, even when light emitted from one pixel PX is penetrated into an adjacent pixel PX through the first portion 250P1 of the passivation structure 250, a light guide path to the adjacent pixel PX may be blocked by the gap 250G. Therefore, undesired light crosstalk between adjacent pixels PX, which may occur through the first portion 250P1 of the passivation structure 250, may be prevented, and contrast characteristics of the semiconductor light-emitting device 200 may be excellent.

Figure 14:
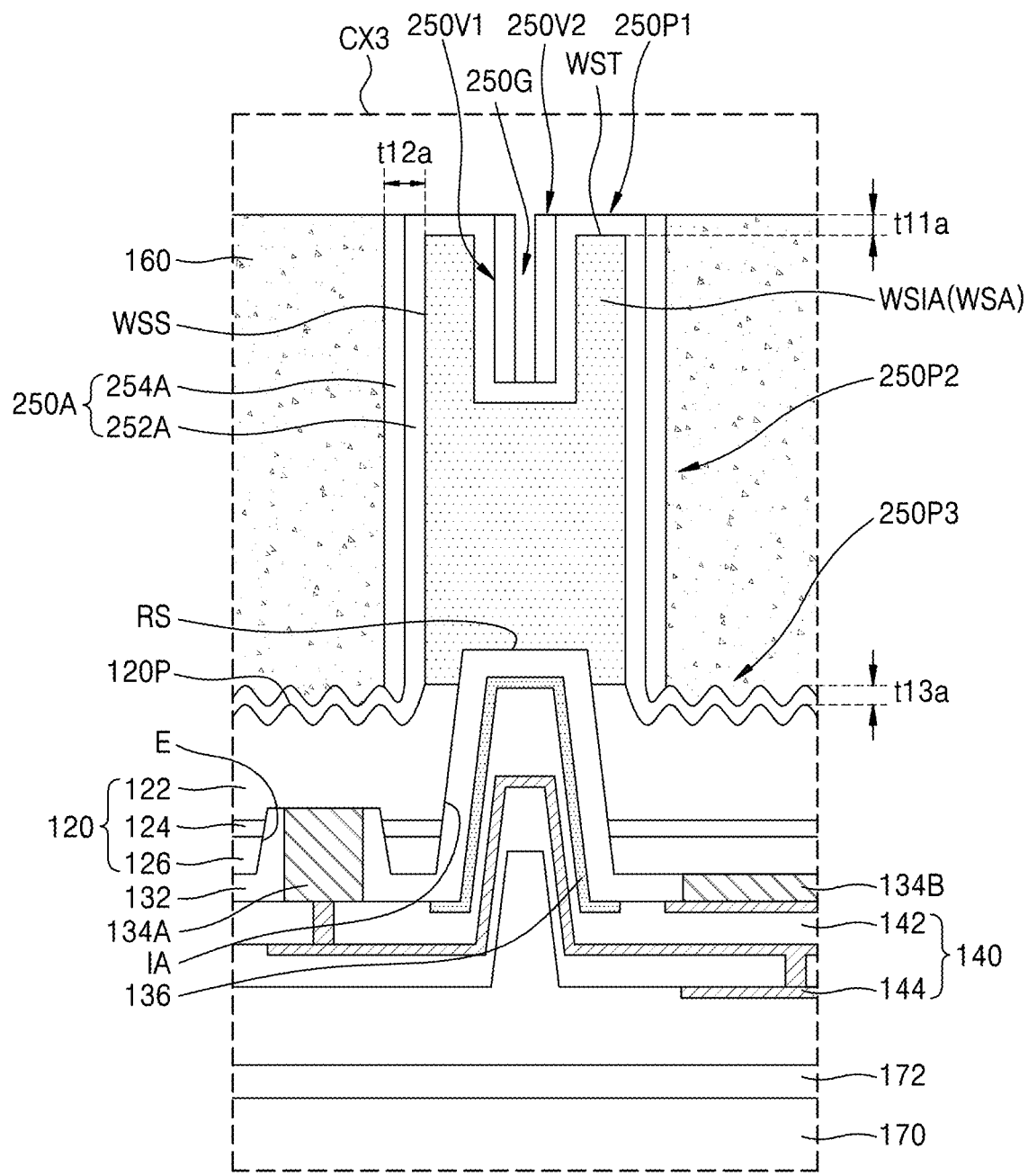
FIG. 14 is a cross-sectional view of a semiconductor light-emitting device according to example embodiments.

FIG. 14 is a cross-sectional view of a semiconductor light-emitting device 200A according to example embodiments. FIG. 14 is an enlarged cross-sectional view corresponding to a cross-section of the portion CX3 of FIG. 12. In FIG. 14, the same reference numerals are used to denote the same elements as in FIGS. 1 to 13.

Referring to FIG. 14, a passivation structure 250A may include a first passivation layer 252A and a second passivation layer 254A. The second passivation layer 254A may not be positioned on a top surface WST of each of a plurality of partition walls WSIA and on a bottom surface of a trench WSH.

In an example manufacturing process, the first passivation layer 252A may be conformally formed on the top surface WST and a sidewall WSS of each of the plurality of partition walls WSIA, an inner wall of the trench WSH, and a top surface of a light-emitting structure 120. Subsequently, the second passivation layer 254A may be formed on the first passivation layer 252A. Then, an anisotropic etching process may be performed on the second passivation layer 254A, and thus, portions of the second passivation layer 254A, which are positioned on the top surface WST of each of the plurality of partition walls WSI, the bottom surface of the trench WSH, and the top surface of the light-emitting structure 120, may be removed, and the second passivation layer 254A may be left on the sidewall WSS of each of the plurality of partition walls WSI and both sidewalls of the trench WSH.

A sidewall reflective layer (refer to 164 in FIG. 8) may be positioned on the sidewall WSS of each of the plurality of partition walls WSIA or inside a gap 250G. A protective layer (refer to 166 in FIG. 8) may be further formed on the sidewall reflective layer 164.

In other embodiments, the partition wall structure WSA described with reference to FIGS. 12 to 14 may be used for any of the semiconductor light-emitting devices 100B, 100C, 100D, 100E, 100F, and 100G described above with reference to FIGS. 6 to 11.

Figure 15:
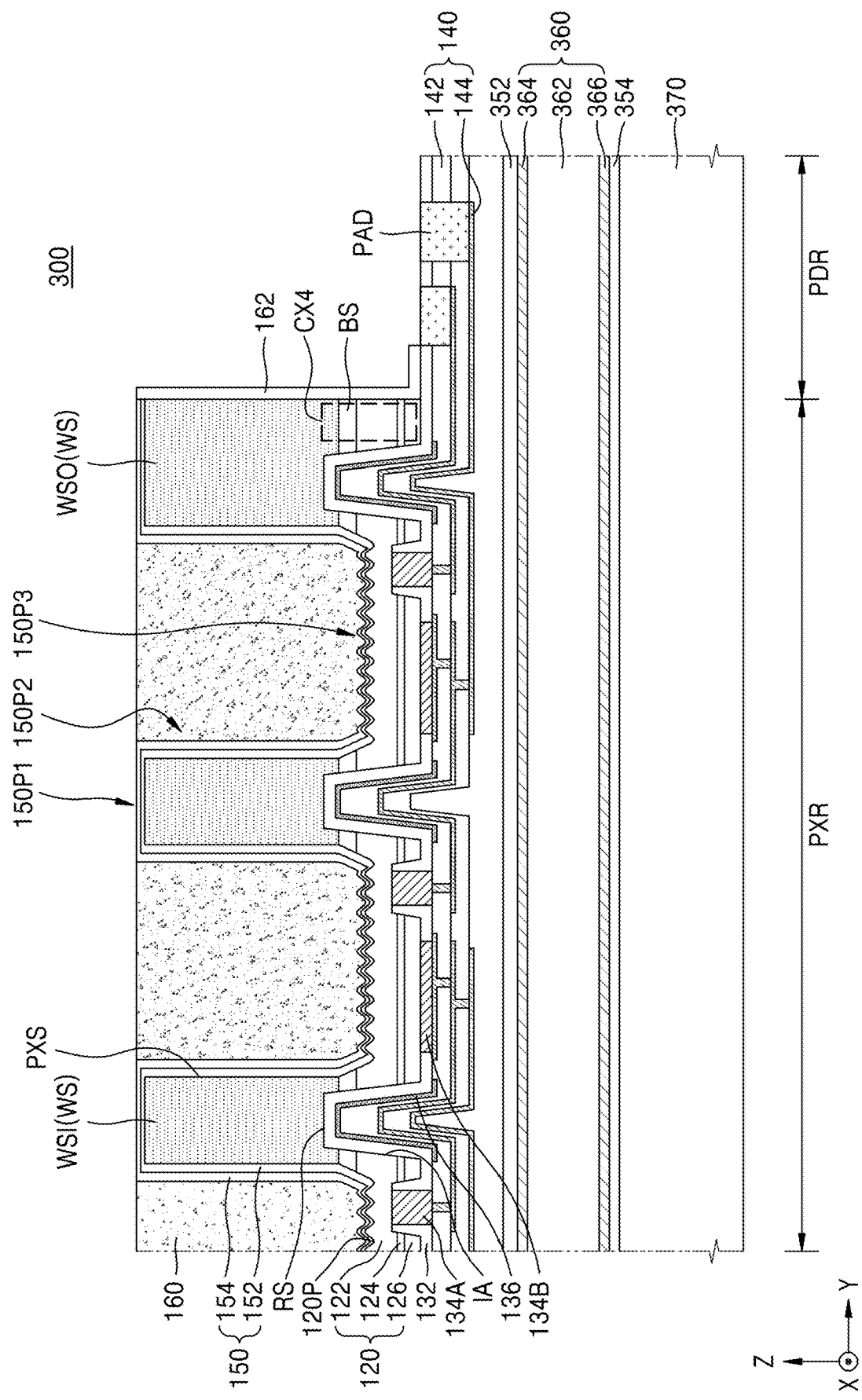
FIG. 15 is a cross-sectional view of a semiconductor light-emitting device according to example embodiments.
Figure 16:
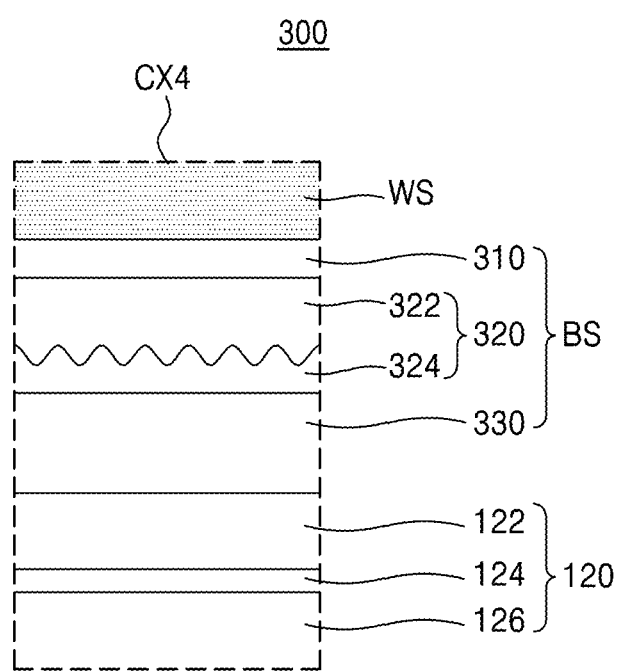
FIG. 16 is an enlarged view of a portion CX4 of FIG. 15.

FIG. 15 is a cross-sectional view of a semiconductor light-emitting device 300 according to example embodiments. FIG. 16 is an enlarged view of a portion CX4 of FIG. 15.

Referring to FIGS. 15 and 16, the semiconductor light-emitting device 300 may further include a buffer structure BS provided between a first conductive semiconductor layer 122 and a partition wall structure WS. The buffer structure BS may include a nucleation layer 310, a dislocation-removing structure 320, and a buffer layer 330, which are sequentially arranged on a bottom surface of the partition wall structure WS toward the first conductive semiconductor layer 122. The dislocation-removing structure 320 may include a first dislocation-removing material layer 322 and a second dislocation-removing material layer 324. FIG. 16 illustrates an example in which one dislocation-removing structure 320 is arranged between the nucleation layer 310 and the buffer layer 330. However, in other embodiments, the buffer structure BS may include at least two dislocation-removing structures 320. For example, a plurality of first dislocation-removing material layers 322 and a plurality of second dislocation-removing material layers 324 may be alternately and repeatedly arranged between the nucleation layer 310 and the buffer layer 330.

In example embodiments, the nucleation layer 310 may be a layer for forming nuclei for crystal growth or assisting the wetting of the dislocation-removing structures 320. For example, the nucleation layer 310 may include aluminum nitride (AlN). The first dislocation-removing material layer 322 may include $B_xAl_yIn_zGa_{1-x-y-z}N$ ($0 \le x < 1$, $0 < y < 1$, $0 \le z < 1$, $0 \le x+y+z < 1$).

In some embodiments, an aluminum (Al) content of the first dislocation-removing material layer 322 may be about 20 atomic percent (at %) to about 75 at %. The second dislocation-removing material layer 324 may have a different lattice constant from the first dislocation-removing material layer 322 and include, for example, aluminum nitride (AlN). At an interface between the first and second dislocation-removing material layers 322 and 324, a dislocation may be bent or a dislocation half-loop may be formed due to a difference in lattice constant between the first and second dislocation-removing material layers 322 and 324, to reduce the dislocation. A thickness of the second dislocation-removing material layer 324 may be less than a thickness of the nucleation layer 310. Thus, tensile stress generated in the second dislocation-removing material layer 324 may be reduced to prevent the occurrence of cracks.

The buffer layer 330 may reduce differences in lattice constant and coefficient of thermal expansion (CTE) between a layer (e.g., the first conductive semiconductor layer 122) formed on the buffer structure BS and the second dislocation-removing material layer 324. For example, the buffer layer 330 may include $B_xAl_yIn_zGa_{1-x-y-z}N$ ($0 \le x < 1$, $0 < y < 1$, $0 \le z < 1$, $0 \le x+y+z < 1$). In some embodiments, an Al content of the buffer layer 330 may be about 20 at % to about 75 at %.

According to example embodiments, the buffer structure BS may not only prevent the generation of cracks in a plurality of light-emitting structures 120 but also prevent the propagation of dislocations into the plurality of light-emitting structures 120, and thus, the crystal quality of the light-emitting structures 120 may be improved.

In example embodiments, a writing structure 140 may be arranged over a top surface of a support structure 360 with a first adhesive layer 352 therebetween, and a printed circuit board (PCB) 370 may be arranged on a bottom surface of the support structure 360 with a second adhesive layer 354 therebetween. The support structure 360 may include a support substrate 362, a first insulating layer 364, and a second insulating layer 366. The first insulating layer 364 may be in contact with the first adhesive layer 352, and the second insulating layer 366 may be in contact with the second adhesive layer 354.

The support substrate 362 may include an insulating substrate or a conductive substrate. The support substrate 362 may have an electric resistance of at least several MΩ, for example, at least 50 MΩ. For example, the support substrate 362 may include doped silicon, undoped silicon, $Al_2O_3$, tungsten (W), copper (Cu), a bismaleimide triazine (BT) resin, an epoxy resin, polyimide, a liquid crystal (LC) polymer, a copper clad laminate, or any combination thereof. The support substrate 362 may have a thickness of at least 150 μm (e.g., about 200 μm to about 400 μm) in a vertical direction (i.e., a Z direction).

Each of the first insulating layer 364 and the second insulating layer 366 may have an electric resistance of at least several tens of MΩ, for example, at least 50 MΩ. For instance, each of the first insulating layer 364 and the second insulating layer 366 may include at least one of $SiO_2$, $Si_3N_4$, $Al_2O_3$, $HfSiO_4$, $Y_2O_3$, $ZrSiO_4$, $HfO_2$, $ZrO_2$, $Ta_2O_5$, and $La_2O_3$.

According to example embodiments, since the support structure 360 has a relatively high electric resistance, the occurrence of failures due to the formation of an undesired conduction path from the wiring structure 140 through the support structure 360 to the PCB 370 in a vertical direction may be prevented.

Figure 17:
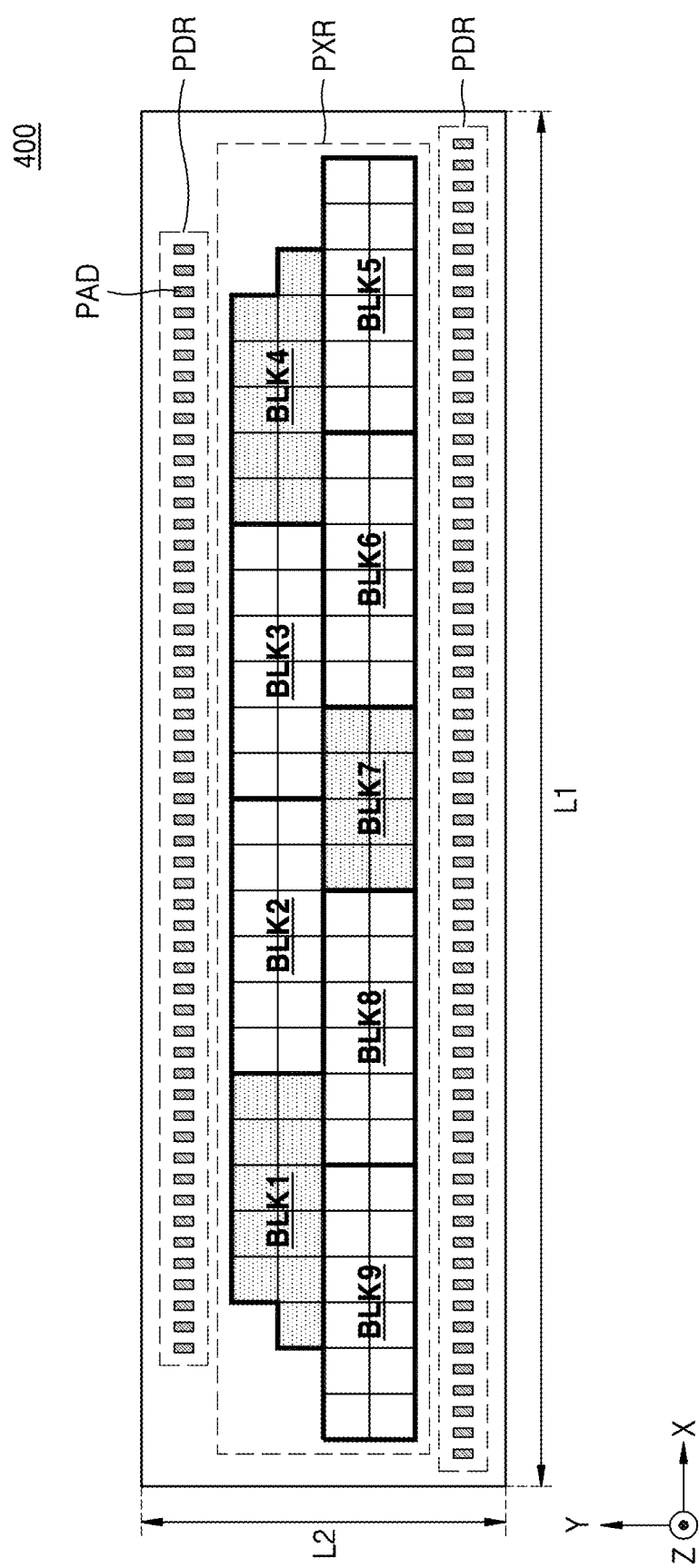
FIG. 17 is a plan view of a semiconductor light-emitting device according to example embodiments.

FIG. 17 is a plan view of a semiconductor light-emitting device 400 according to example embodiments.

Referring to FIG. 17, the semiconductor light-emitting device 400 may include a plurality of cell blocks (e.g., BLK1 to BLK9). The number of light-emitting cells included in at least one of the cell blocks BLK1 to BLK9 may be different from the number of light-emitting cells included in each of the remaining ones of the cell blocks BLK1 to BLK9. In an example embodiment, the semiconductor light-emitting device 400 may include a specific cell block (e.g., BLK7), which is positioned in the center of a pixel region PXR and includes a smaller number of light-emitting cells than other cell blocks. For example, when the semiconductor light-emitting device 400 is included and used in a light source module for a vehicle headlamp, the light source module may need to irradiate light having a relatively high light intensity to a central area in front of a user in a direction in which the user travels. Thus, it may be required to supply a relatively large current to the specific cell block (e.g., BLK7) positioned in the center of the pixel region PXR. Because the specific cell block (e.g., BLK7) positioned in the center of the pixel region PXR includes a relatively small number of light-emitting cells, even when the relatively large current is supplied to the specific cell block, the total power consumption caused by the specific cell block may be reduced.

In an example embodiment, the semiconductor light-emitting device 400 may include specific cell blocks (e.g., BLK1 and BLK4), which are positioned at an outer portion of the pixel region PXR and include a smaller number of light-emitting cells than other cell blocks. The semiconductor light-emitting device 400 may have a low need to irradiate light to upper outer areas in front of a user in a direction in which the user travels. Because the specific cell blocks (e.g., BLK1 and BLK4) positioned at the outer portion of the pixel region PXR include the smaller number of light-emitting cells than the other cell blocks, the light source module including the semiconductor light-emitting device 400 may not separately irradiate light to unnecessary areas.

According to example embodiments, the cell blocks BLK1 to BLK9 may be arranged in a total of two rows (i.e., a first row and a second row). From among light-emitting cells included in cell blocks arranged in the first row, light-emitting cells arranged adjacent to each other in a Y direction may be driven (or turned on) or not driven (or turned off) at the same time. According to example embodiments, partition wall structures WS may not be formed between the light-emitting cells arranged adjacent to each other in the Y direction, from among the light-emitting cells included in the cell blocks arranged in the first row.

According to example embodiments, in a plan view viewed from above, the semiconductor light-emitting device 400 may have a roughly rectangular shape. According to example embodiments, an X-directional length L1 of the semiconductor light-emitting device 400 may be greater than or equal to about 1.1 times a Y-directional length L2 thereof. According to example embodiments, the X-directional length L1 of the semiconductor light-emitting device 400 may be less than or equal to about 100 times the Y-directional length L2 thereof. According to example embodiments, a thickness (i.e., a Z-directional length) of the semiconductor light-emitting device 400 may be several tens of μm to several hundreds of μm and be less than or equal to about 1/10 of the X-directional length L1 of the semiconductor light-emitting device 400. The semiconductor light-emitting device 400 according to example embodiments may have dimensions optimized for resistance to physical stress, and the warpage of the semiconductor light-emitting device 400 may be minimized.

FIGS. 18A to 18M are cross-sectional views illustrating a process sequence of a method of manufacturing a semiconductor light-emitting device, according to example embodiments. FIGS. 18A to 18M are cross-sectional views corresponding to a cross section taken along line A1-A1' of FIG. 2.

Figure 18A:
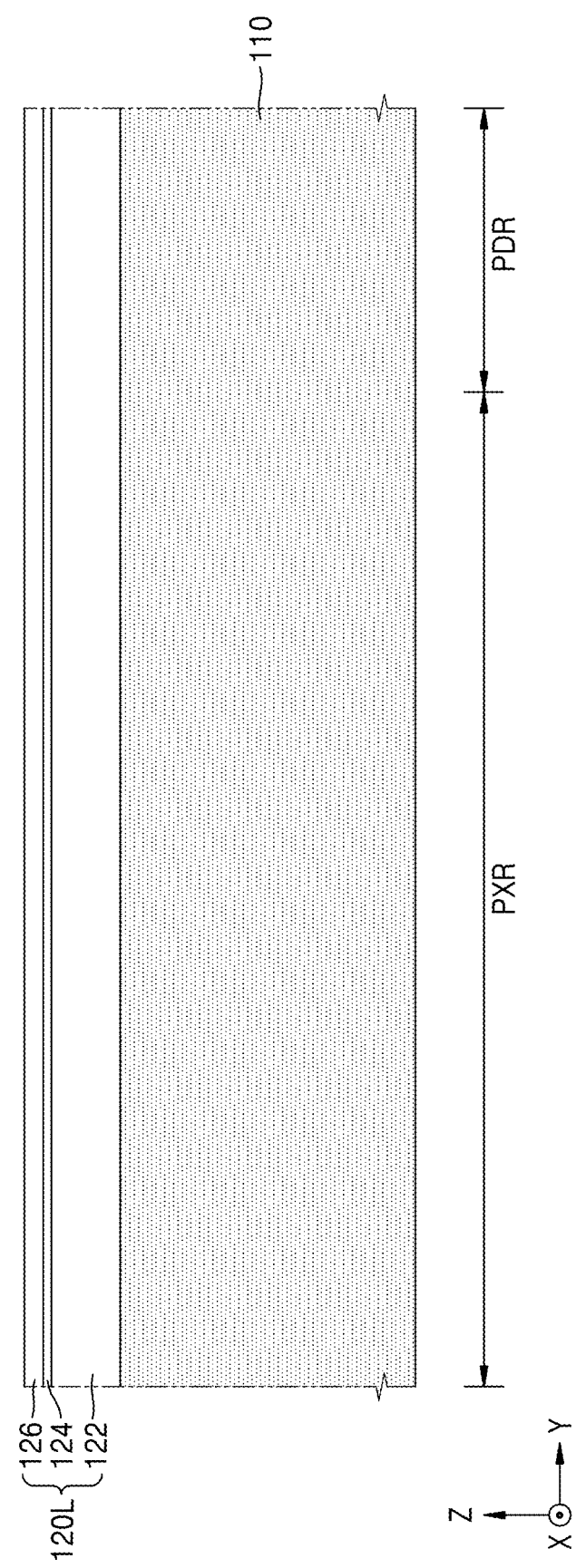

Referring to FIG. 18A, a light-emitting stack 120L may be formed on a substrate 110.

In example embodiments, the substrate 110 may include a silicon (Si) substrate, a silicon carbide (SiC) substrate, a sapphire substrate, a gallium nitride (GaN) substrate, or the like. The substrate 110 may include a pixel region PXR and a pad region PDR. In a plan view, the pad region PDR may be arranged on at least one side of the pixel region PXR, for example, on both sides of the pixel region PXR or around the pixel region PXR.

The light-emitting stack 120L may include a first conductive semiconductor layer 122, an active layer 124, and a second conductive semiconductor layer 126, which are sequentially formed on a top surface of the substrate 110.

Figure 18B:
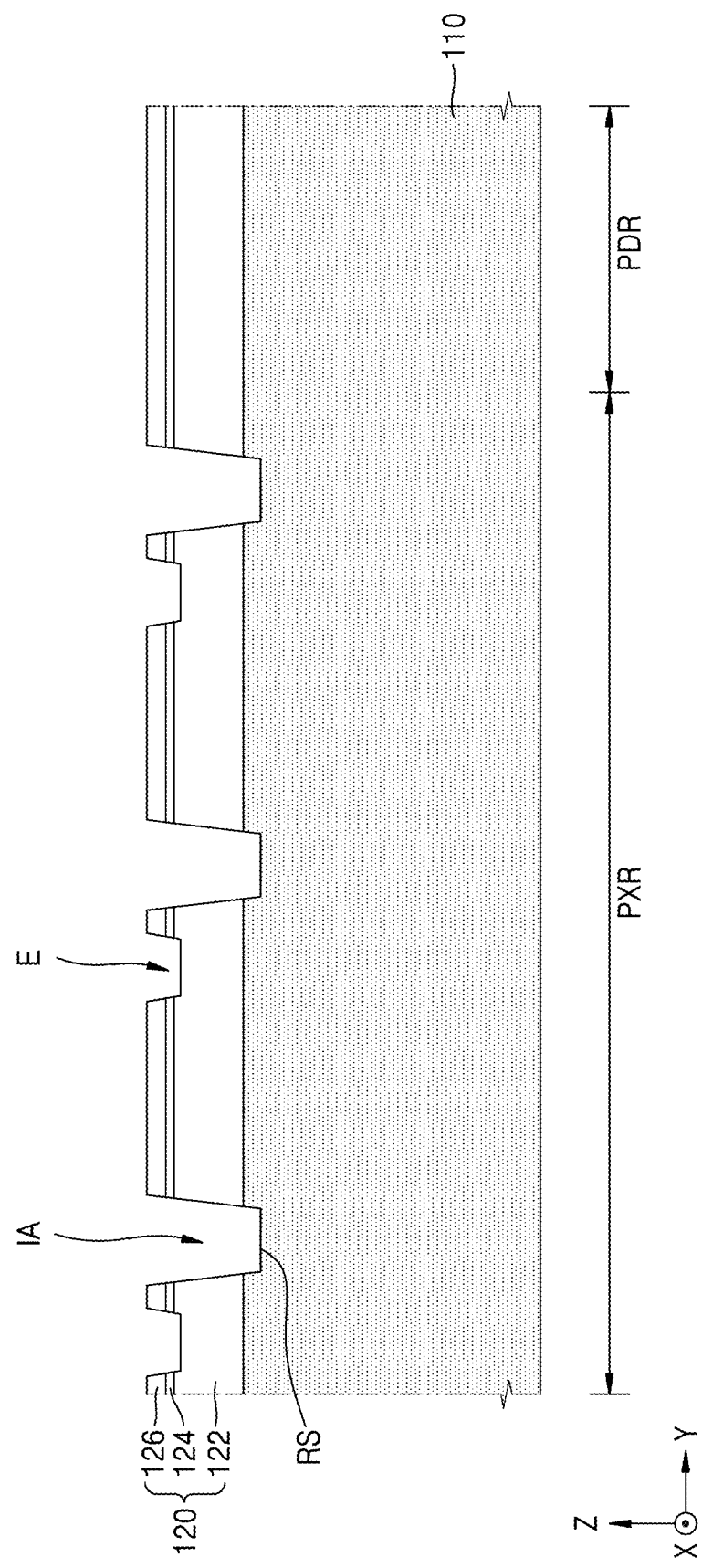

Referring to FIG. 18B, a mask pattern (not shown) may be formed on the light-emitting stack 120L, and a portion of the light-emitting stack 120L may be removed using the mask pattern as an etching mask and thus an opening E may be formed. The opening E may expose a top surface of the first conductive semiconductor layer 122. The opening E may not be formed on the pad region PDR of the substrate 110.

Thereafter, a mask pattern (not shown) may be formed, and a portion of the light-emitting stack 120L may be removed using the mask pattern as an etch mask, and thus, a device isolation region IA may be formed. In this case, a plurality of light-emitting structures 120 may be formed and separated from each other by the device isolation region IA.

In example embodiments, a process of forming the device isolation region IA may be performed by a blade, but is not limited thereto. As shown in FIG. 18B, a cross-sectional shape of each of the plurality of light-emitting structures 120 obtained by the process of forming the device isolation region IA may be a trapezoid shape whose upper width is less than a lower width thereof. However, the inventive concept is not limited thereto. A portion of the substrate 110 may be removed during the process of forming the device isolation region IA, and thus, a recess region RS may be formed in the substrate 110.

Figure 18C:
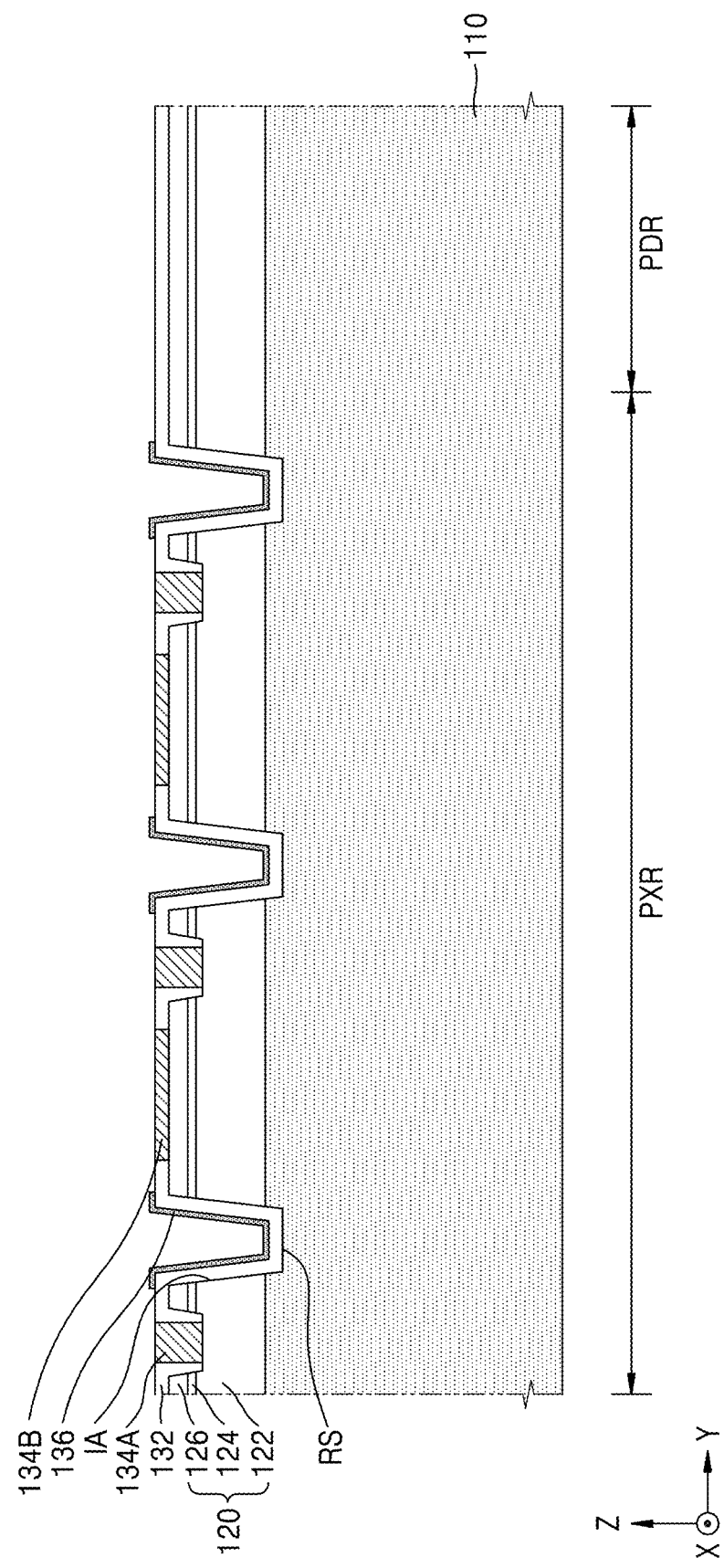

Referring to FIG. 18C, an insulating liner 132 may be formed to conformally cover the plurality of light-emitting structures 120. Thereafter, a portion of the insulating liner 132 may be removed to expose a top surface of the second conductive semiconductor layer 126, and a second contact 134B may be formed on the exposed top surface of the second conductive semiconductor layer 126. The second contact 134B may be formed using Ag, Al, Ni, Cr, Au, Pt, Pd, Sn, W, Rh, Ir, Ru, Mg, Zn, Ti, Cu or any combination thereof. In some embodiments, before the second contact 134B is formed, an ohmic metal layer including a conductive ohmic material may be further formed on the top surface of the second conductive semiconductor layer 126.

Subsequently, a portion of the insulating liner 132 may be removed inside the opening E to expose a top surface of the first conductive semiconductor layer 122, and a first contact 134A may be formed on the exposed top surface of the first conductive semiconductor layer 122. The first contact 134A may be formed using Ag, Al, Ni, Cr, Au, Pt, Pd, Sn, W, Rh, Ir, Ru, Mg, Zn, Ti, Cu or any combination thereof. In some embodiments, before the first contact 134A is formed, an ohmic metal layer including a conductive ohmic material may be further formed on the top surface of the first conductive semiconductor layer 122.

Thereafter, a lower reflective layer 136 may be formed on the insulating liner 132 along an inner wall of the device isolation region IA. In other embodiments, the lower reflective layer 136 may be formed during the formation of the first contact 134A or may be formed during the formation of the second contact 134B.

Figure 18D:
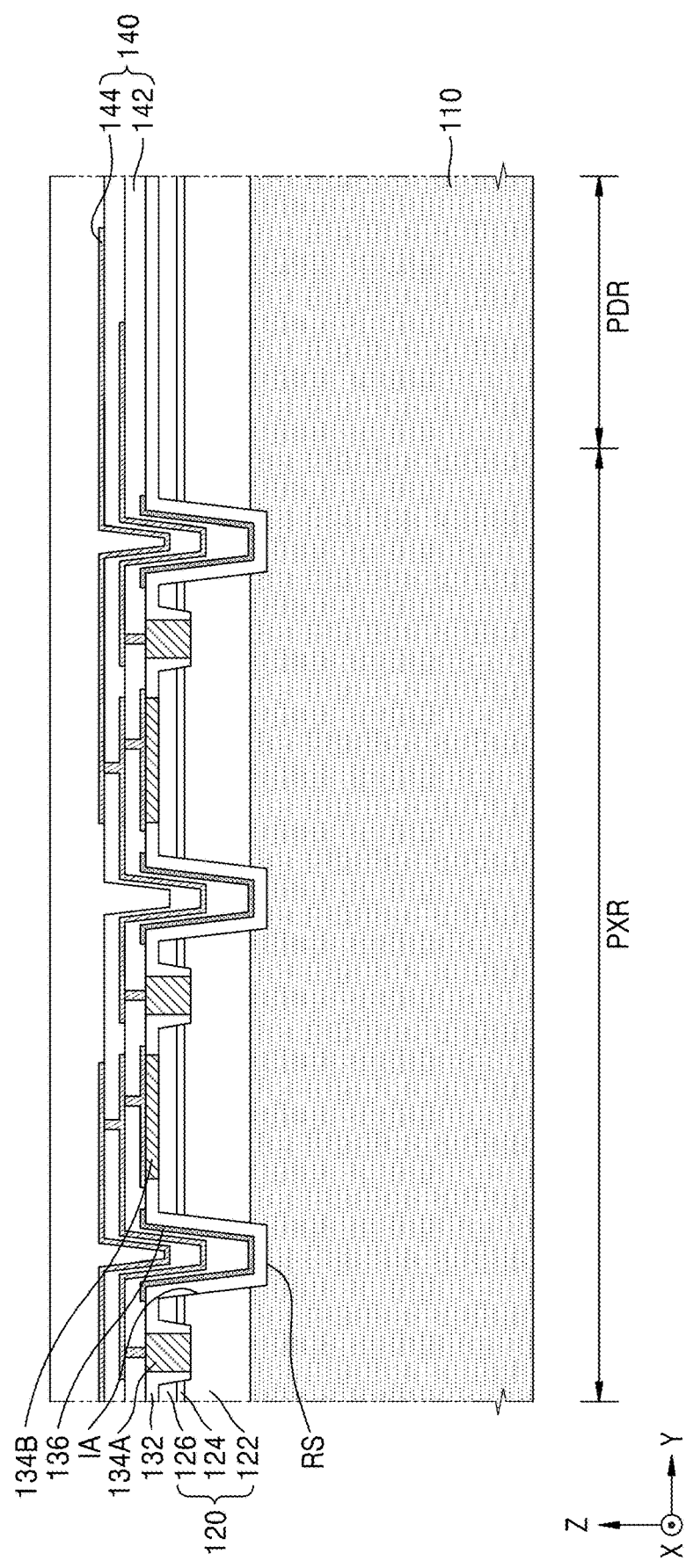

Referring to FIG. 18D, a wiring structure 140 may be formed on the insulating liner 132, the first contact 134A, the second contact 134B, and the lower reflective layer 136. For example, a conductive layer (not shown) may be formed on the insulating liner 132, the first contact 134A, the second contact 134B, and the lower reflective layer 136. The conductive layer may be patterned to form a wiring layer 144, and an insulating layer 142 may be formed to cover the wiring layer 144. By repeating the processes of forming the wiring layer 144 and the insulating layer 142, the wiring structure 140 including a plurality of wiring layers 144 and a plurality of insulating layers 142 may be formed. In example embodiments, at least some of the plurality of wiring layers 144 may be formed using a plating process.

Figure 18E:
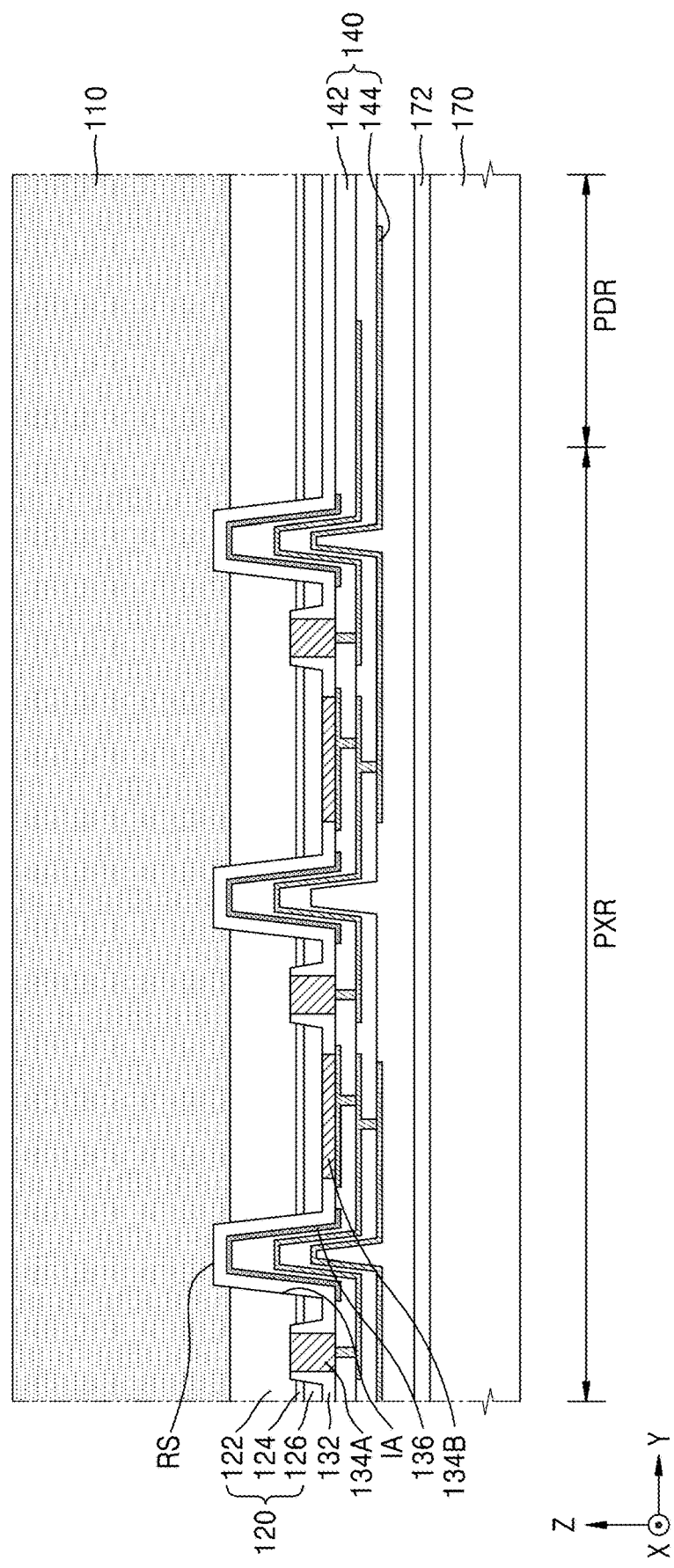

Referring to FIG. 18E, an adhesive layer 172 may be formed on the wiring structure 140, and a support substrate 170 may be attached onto the adhesive layer 172. Thereafter, the light-emitting structures 120 attached to the support substrate 170 may be reversed such that a surface opposite to a surface of the substrate 110, which is in contact with the light-emitting structures 120, faces upward. Then, the top surface of the substrate 110 may be partially removed using a grinding process.

Referring to FIG. 18F, a mask pattern (not shown) may be formed on the substrate 110, and portions of the substrate 110 may be removed using the mask pattern as an etch mask, and thus, a plurality of pixel spaces PXS may be formed on the pixel region PXR of the substrate 110. Portions of the substrate 110, which are arranged between the plurality of pixel spaces PXS in the pixel region PXR, may be referred to as a plurality of partition walls WSI.

The plurality of partition walls WSI may be positioned to vertically overlap the device isolation region IA, and the plurality of light-emitting structures 120 may be arranged in the plurality of pixel spaces PXS, respectively. The top surface of the first conductive semiconductor layer 122 (i.e., top surfaces of the plurality of light-emitting structures 120) may be exposed at bottoms of the plurality of pixel spaces PXS.

Thereafter, an etching process may be performed on the first conductive semiconductor layer 122 exposed at the bottoms of the plurality of pixel spaces PXS, and thus, concave/convex portions 120P may be formed. However, in other embodiments, the etching process for forming the concave/convex portions 120P may be omitted.

In other embodiments, an upper portion of each of the plurality of partition walls WSI may be further removed to form a trench (refer to WSH in FIG. 12), which extends in a vertical direction from a top surface WST of each of the plurality of partition walls WSI. In this case, the semiconductor light-emitting device 200 described above with reference to FIGS. 12 and 13 may be formed.

Figure 18G:
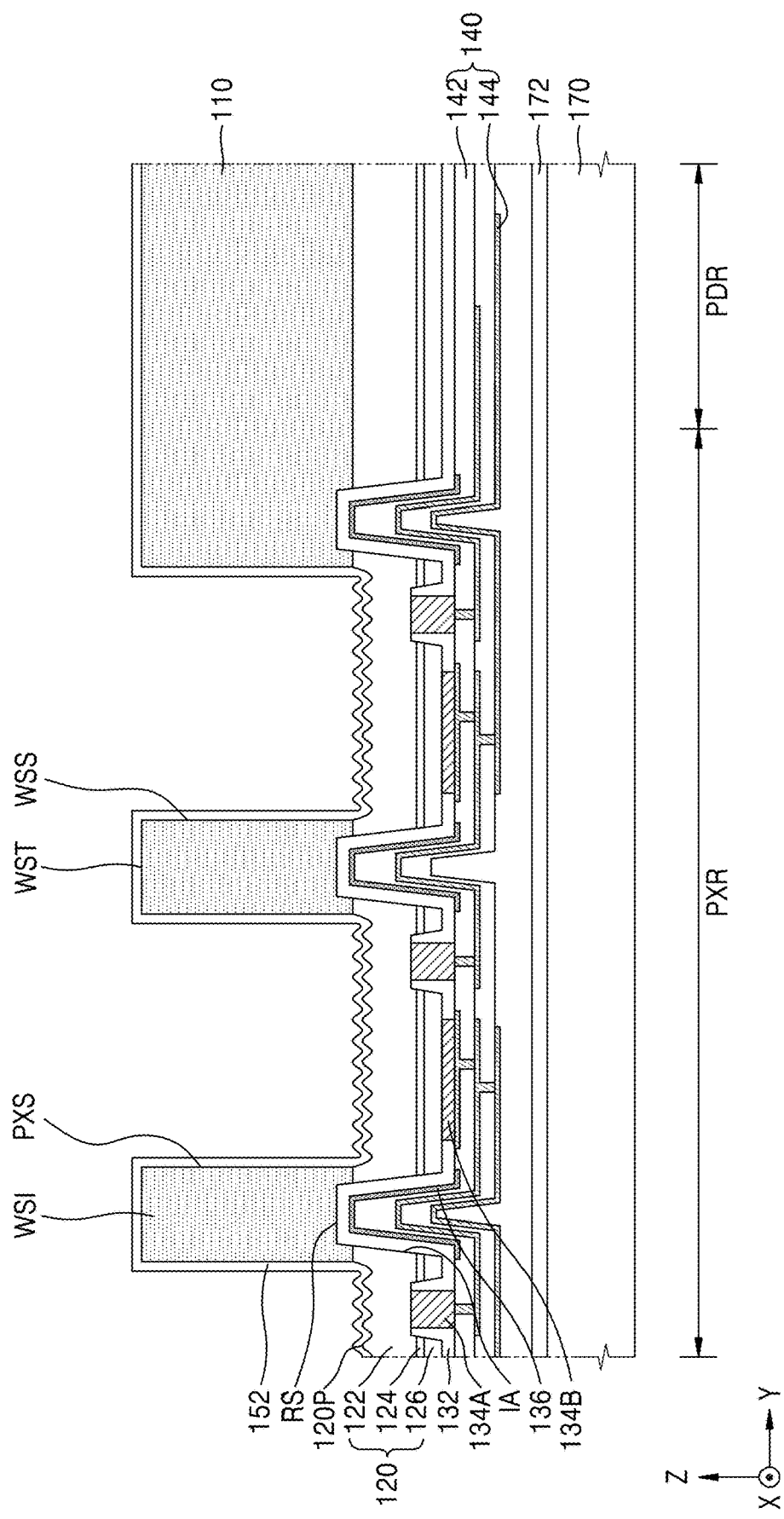

Referring to FIG. 18G, a first passivation layer 152 may be formed on the plurality of partition walls WSI and the substrate 110. The first passivation layer 152 may be formed on top surfaces WST and sidewalls WSS of the plurality of partition walls WSI and the top surfaces of the plurality of light-emitting structures 120.

In example embodiments, the first passivation layer 152 may be formed using a first insulating material, which is at least one of silicon oxide, silicon nitride, silicon oxynitride, aluminum oxide, and aluminum nitride. The first passivation layer 152 may be formed using an ALD process or a chemical vapor deposition (CVD) process.

Figure 18H:
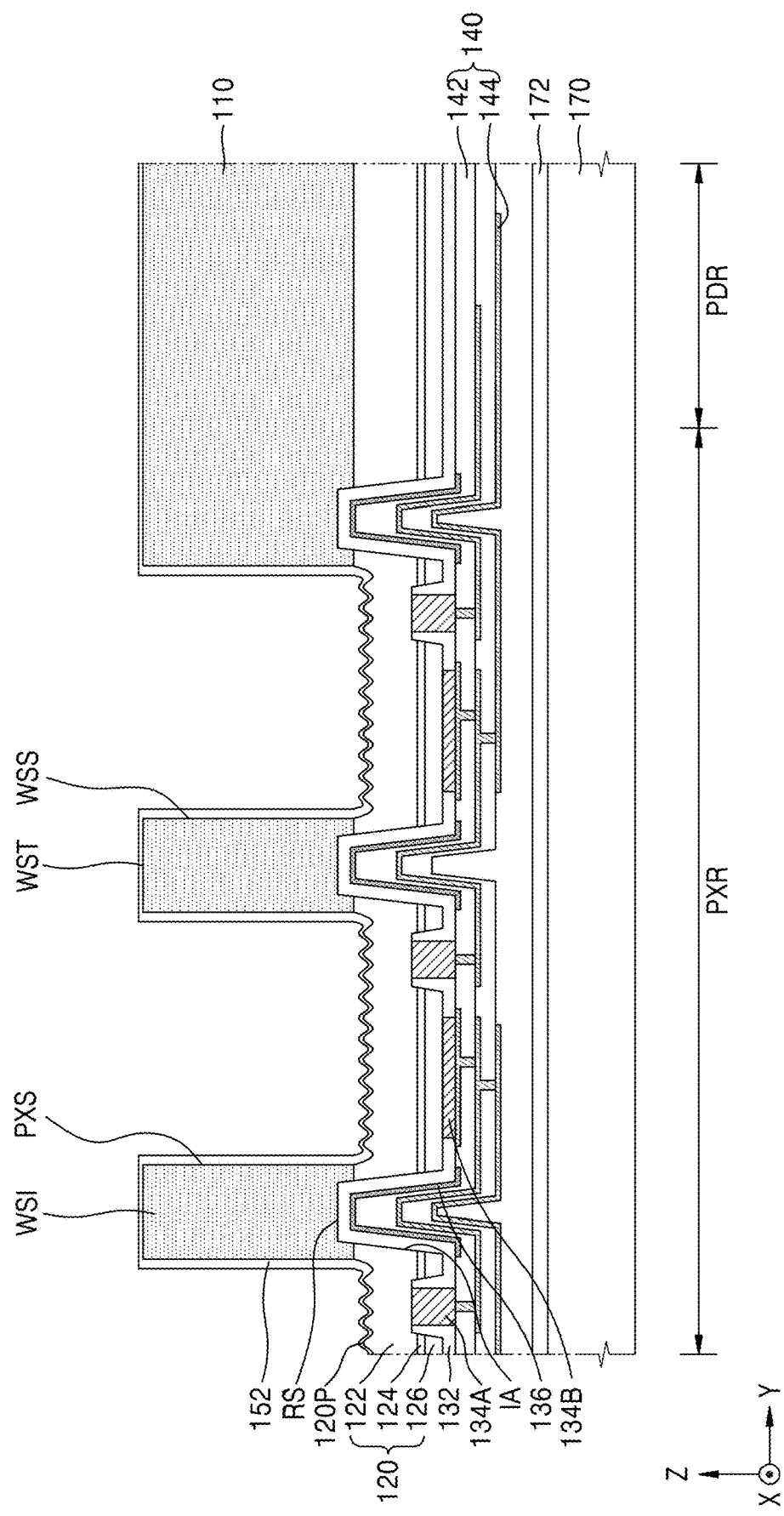

Referring to FIG. 18H, an anisotropic etching process or a trimming process may be performed on the first passivation layer 152, and thus, a thickness of the first passivation layer 152 positioned on the top surfaces WST of the plurality of partition walls WSI and the top surfaces of the plurality of light-emitting structures 120 may be reduced.

In some embodiments, portions of the first passivation layer 152, which are positioned on the top surfaces WST of the plurality of partition walls WSI and the top surfaces of the plurality of light-emitting structures 120, may be completely removed, while the first passivation layer 152 may be left on the sidewalls WSS of the plurality of partition walls WSI. In this case, the semiconductor light-emitting device 100B described above with reference to FIG. 6 may be formed.

Figure 18I:
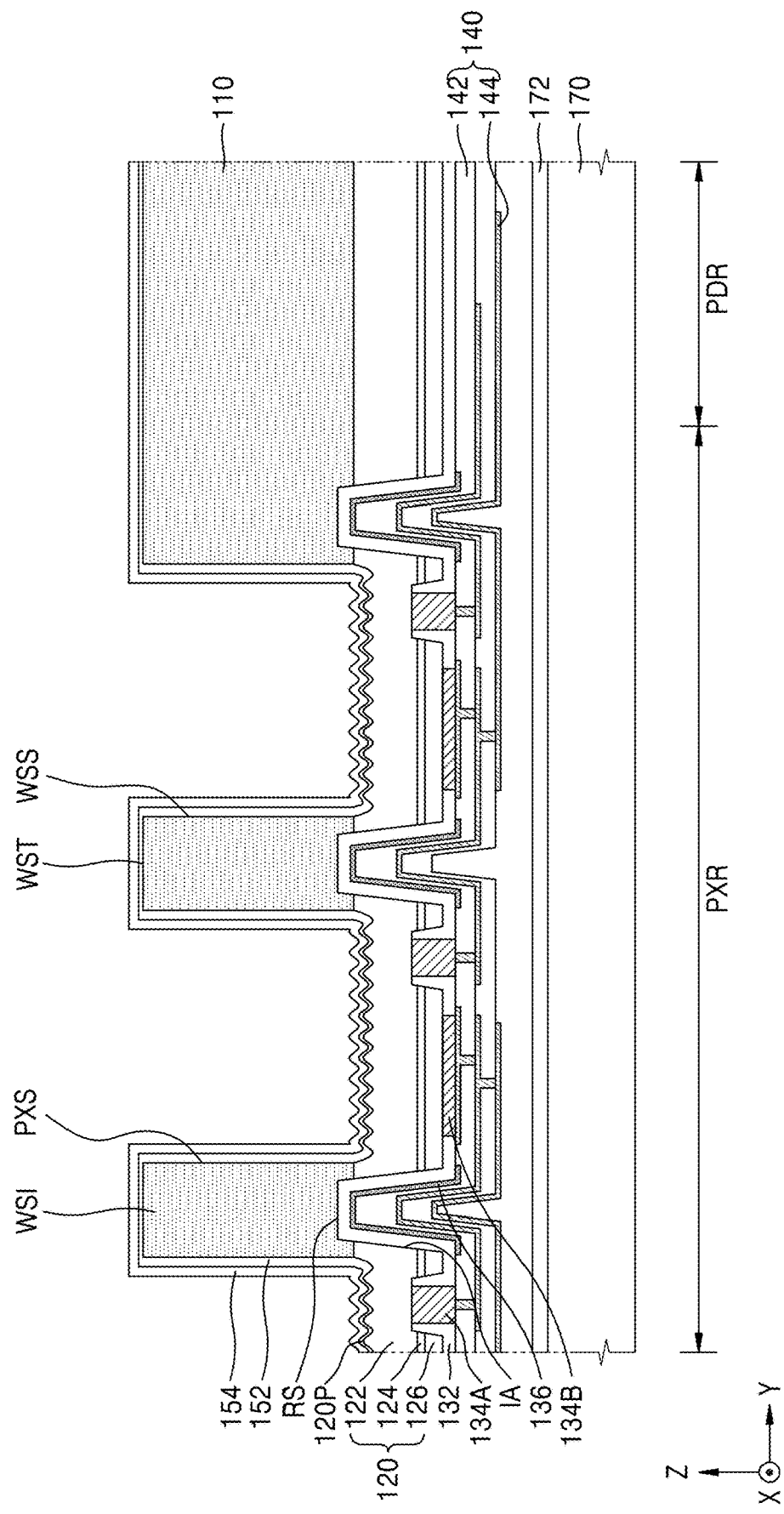

Referring to FIG. 18I, a second passivation layer 154 may be formed on the first passivation layer 152. The second passivation layer 154 may be formed on the top surfaces WST and the sidewalls WSS of the plurality of partition walls WSI and the top surfaces of the plurality of light-emitting structures 120.

In example embodiments, the second passivation layer 154 may be formed using a second insulating material, which includes at least one of silicon oxide, silicon nitride, silicon oxynitride, aluminum oxide, and aluminum nitride. The second insulating material may be different from the first insulating material included in the first passivation layer 152. The second passivation layer 154 may be formed using an ALD process or a CVD process.

Figure 18J:
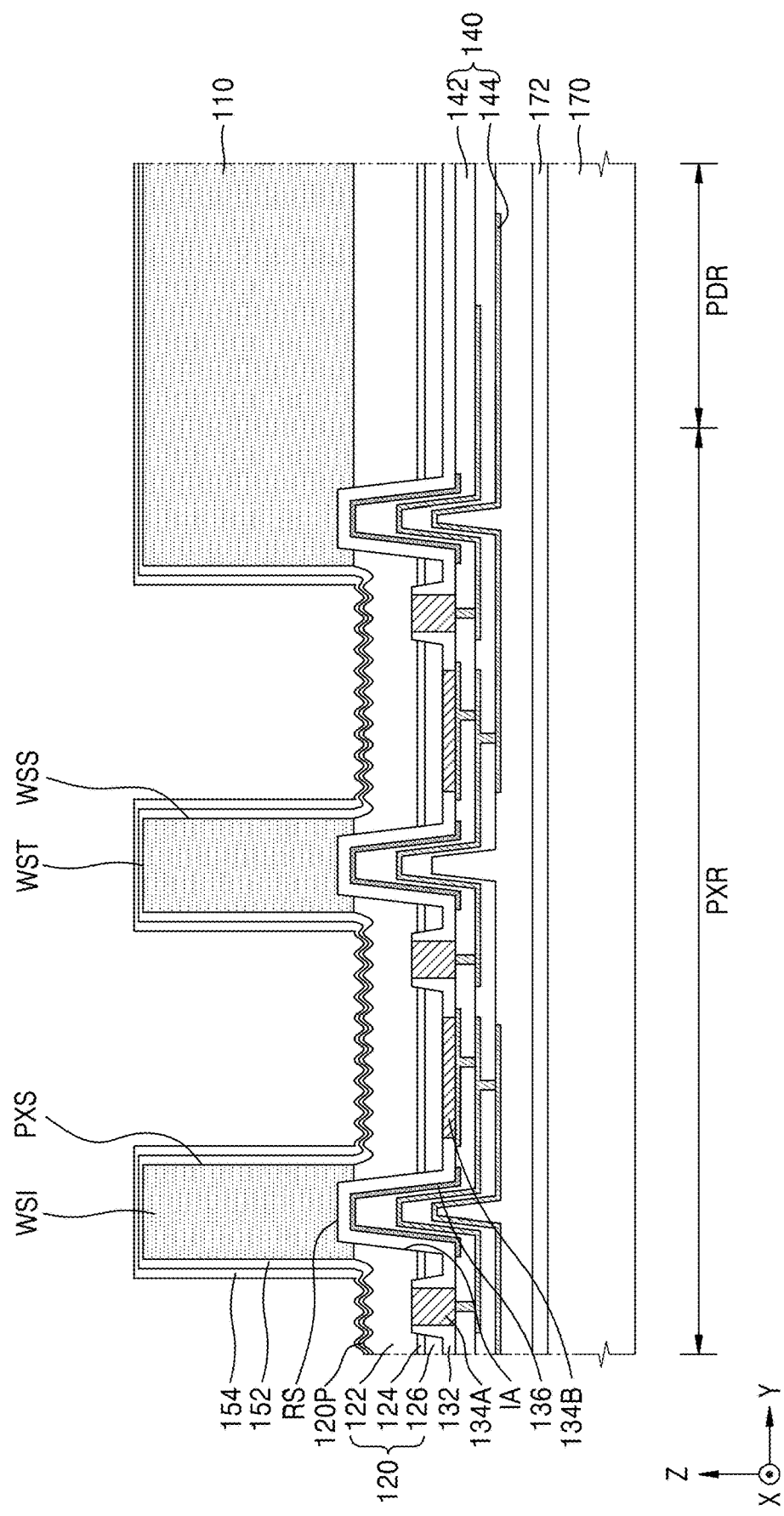

Referring to FIG. 18J, an anisotropic etching process or a trimming process may be performed on the second passivation layer 154, and thus, a thickness of the second passivation layer 154 positioned on the top surfaces WST of the plurality of partition walls WSI and the top surfaces of the plurality of light-emitting structures 120 may be reduced.

Although not shown, a metal layer (not shown) may be formed on the top surface of the substrate 110 and on inner walls of the plurality of pixel spaces PXS, and an anisotropic etching process may be performed on the metal layer to thereby form a sidewall reflective layer (refer to 164 in FIG. 8) on the sidewalls of the plurality of pixel spaces PXS (or the sidewall of the second passivation layer 154). For example, the sidewall reflective layer 164 may be formed using Ag, Al, Ni, Cr, Au, Pt, Pd, Sn, W, Rh, Ir, Ru, Mg, Zn, or any combination thereof. Thereafter, a protective layer (refer to 166 in FIG. 8) may be formed on the sidewall reflective layer 164 and on the inner walls of the plurality of pixel spaces PXS.

In some other embodiments, portions of the second passivation layer 154, which are positioned on the top surfaces WST of the plurality of partition walls WSI and the top surfaces of the plurality of light-emitting structures 120, may be completely removed, while the second passivation layer 154 may be left on the sidewalls WSS of the plurality of partition walls WSI. In this case, the semiconductor light-emitting device 100A described above with reference to FIG. 5 may be formed.

In some other embodiments, a third passivation layer 156c may be further formed on the second passivation layer 154. In this case, the semiconductor light-emitting device 100C described above with reference to FIG. 7 may be formed.

Figure 18K:
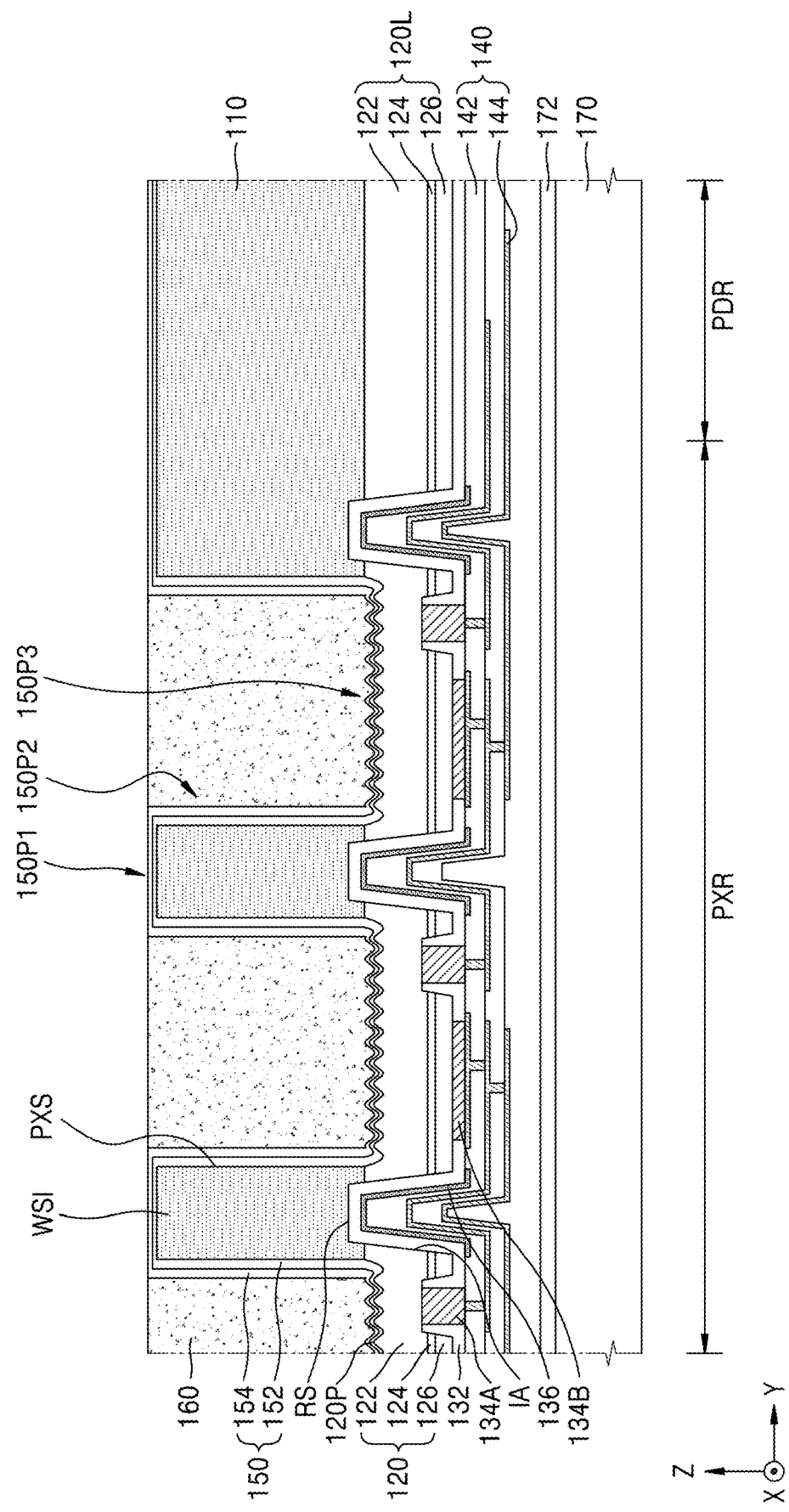

Referring to FIG. 18K, a fluorescent layer 160 may be formed to fill the plurality of pixel spaces PXS.

In example embodiments, the fluorescent layer 160 may be formed by applying or dispensing a resin containing fluorescent material particles dispersed therein into the plurality of pixel spaces PXS.

Figure 18L:
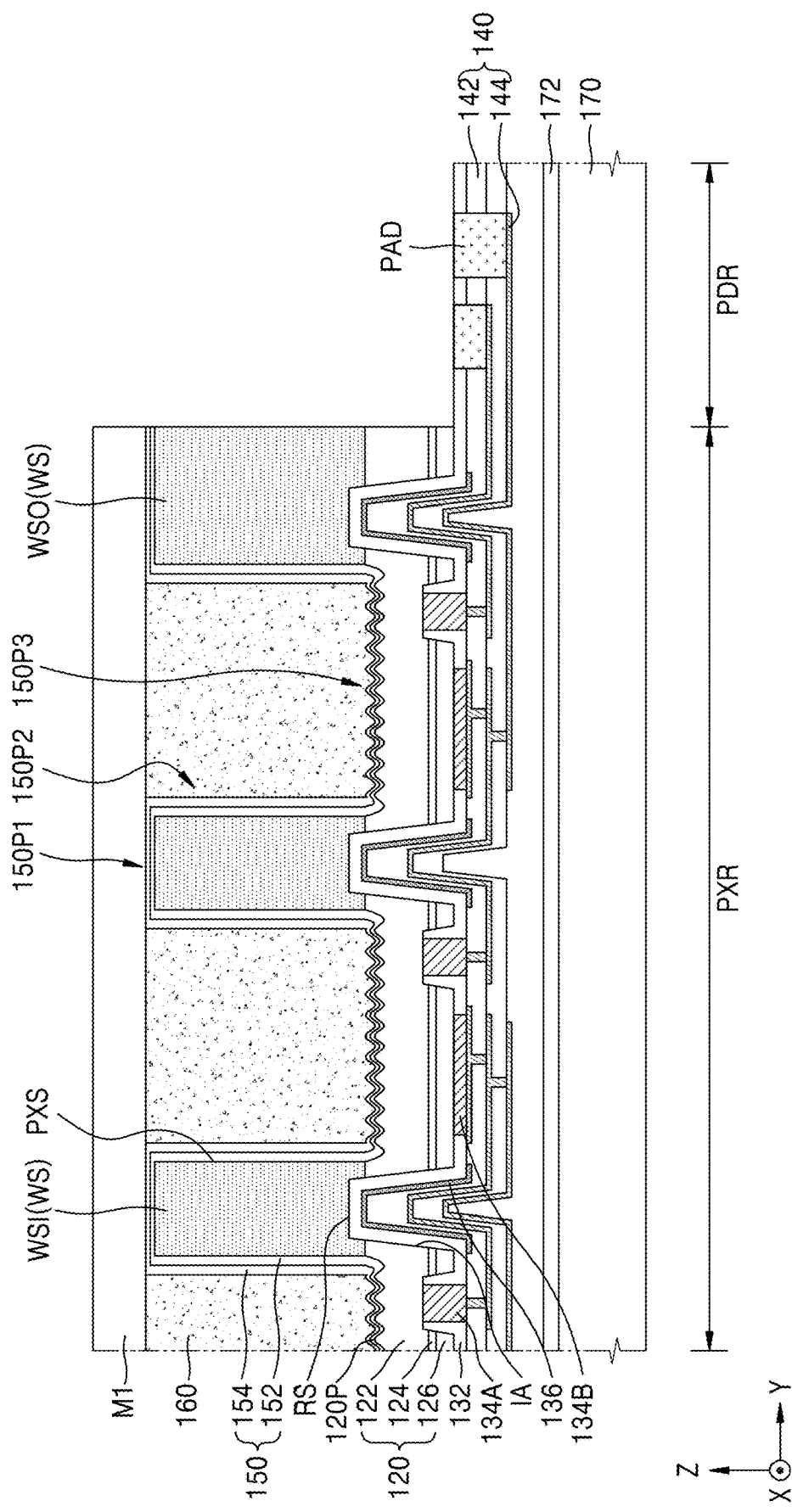

Referring to FIG. 18L, a mask pattern M1 may be formed to cover the fluorescent layer 160 and the plurality of partition walls WSI in the pixel region PXR. A portion of the substrate 110 may be removed using the mask pattern M1 as an etch mask, and thus, an outer partition wall WSO may be formed.

Thereafter, the light-emitting stack 120L exposed outside the outer partition wall WSO may be removed to expose the wiring structure 140. Afterwards, an opening may be formed in the wiring structure 140 and filled with a conductive material to form a pad unit PAD.

Figure 18M:
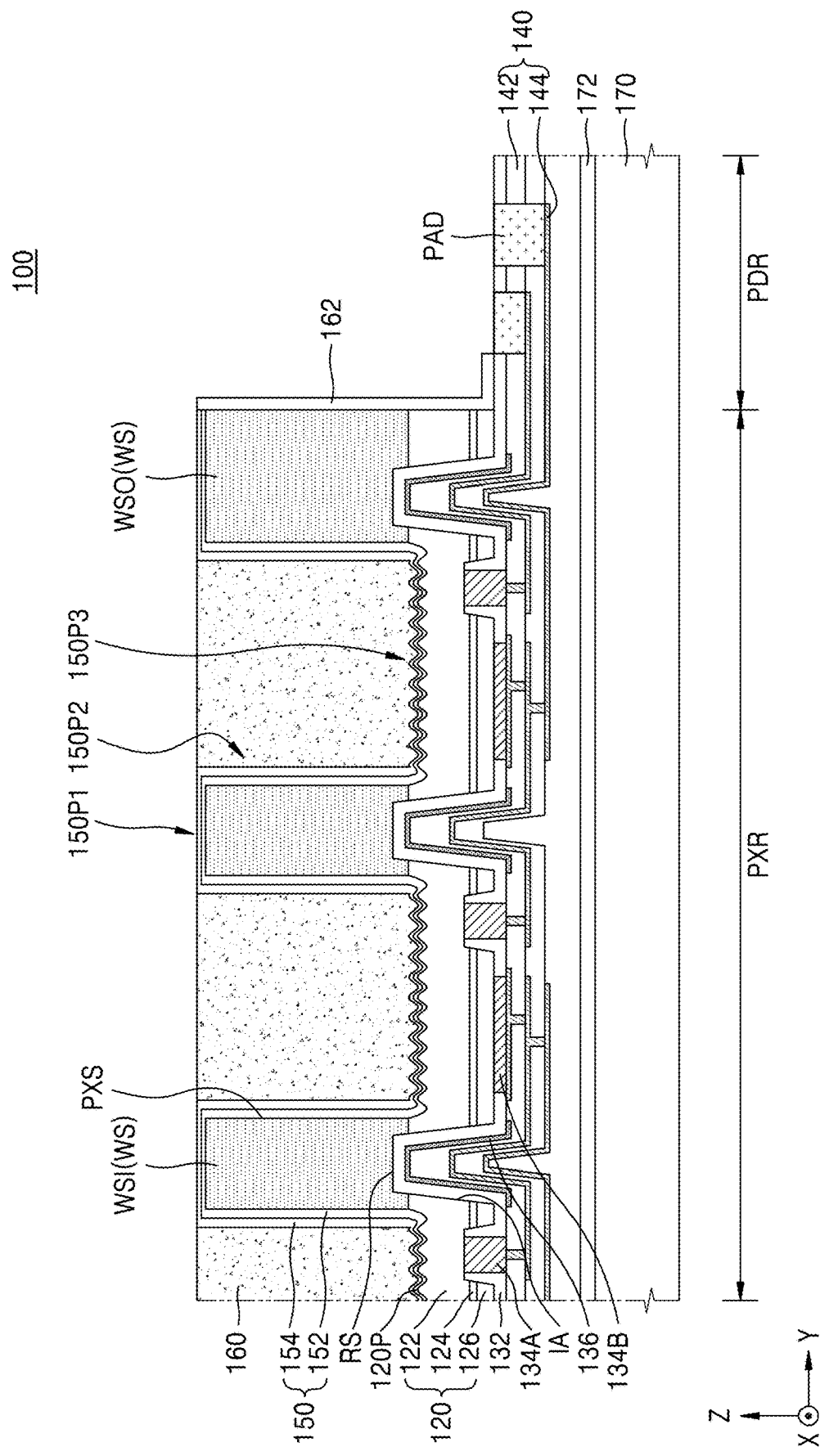

Referring to FIG. 18M, the mask pattern M1 may be removed. Subsequently, an edge protective layer 162 may be formed using an insulating material on an outer sidewall of the outer partition wall WSO. The edge protective layer 162 may wholly or partially cover a top surface of the pad unit PAD.

The manufacture of the semiconductor light-emitting device 100 may be completed using the above-described processes.

In general, during a process of forming a passivation layer covering a partition wall structure WS, a thickness of a portion of the passivation layer, which is formed on a top surface of the partition wall structure WS, may be greater than a thickness of a portion of the passivation layer, which is formed on a sidewall of the partition wall structure WS. In this case, the portion of the passivation layer, which is formed on the top surface of the partition wall structure WS, may act as a light guide, and thus, light emitted from one pixel PX may be adsorbed or penetrated into an adjacent pixel PX.

However, according to example embodiments, an anisotropic etching process or a trimming process may be performed on the first passivation layer 152 to reduce a thickness of the first passivation layer 152 on the top surfaces WST of the plurality of partition walls WSI. Also, an anisotropic etching process or a trimming process may be performed on the second passivation layer 154 to reduce a thickness of the second passivation layer 154 on the top surfaces WST of the plurality of partition walls WSI. Thus, the passivation structure 150 positioned on the top surfaces WST of the plurality of partition walls WSI (i.e., the first portion 150P1 of the passivation structure 150) may have a relatively reduced thickness. Accordingly, the absorption or penetration of light emitted from one pixel PX into an adjacent pixel PX through the first portion 150P1 of the passivation structure 150 may be reduced or prevented, and contrast characteristics of the semiconductor light-emitting device 100 may be excellent.

Figure 19:
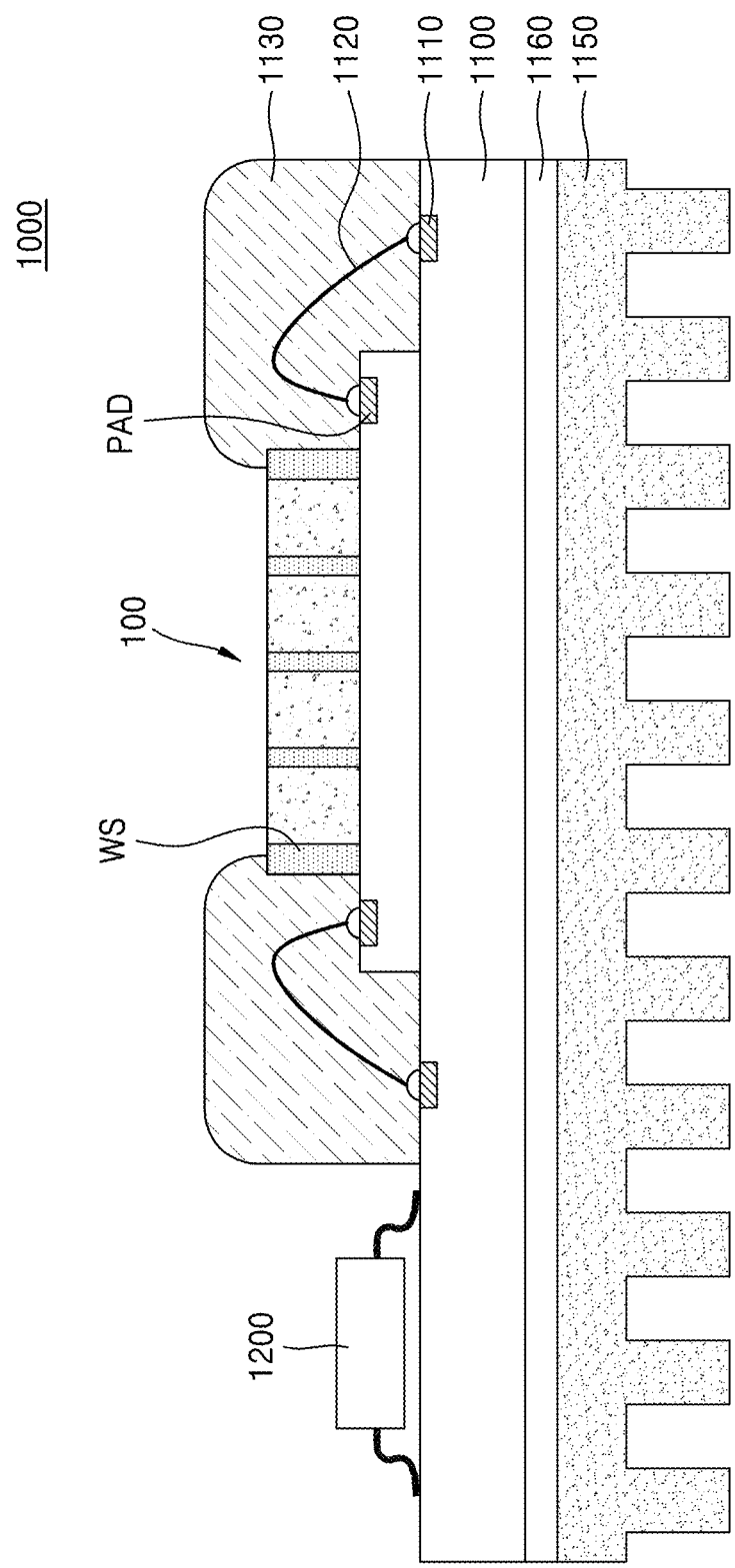
FIG. 19 is a cross-sectional view of a light source module including a semiconductor light-emitting device, according to example embodiments.

FIG. 19 is a cross-sectional view of a light source module 1000 including a semiconductor light-emitting device, according to example embodiments. In FIG. 19, the same reference numerals are used to denote the same elements as in FIGS. 1 to 18.

Referring to FIG. 19, the light source module 1000 may include a semiconductor light-emitting device 100 and a driving semiconductor chip 1200, which are mounted on a PCB 1100.

The PCB 1100 may include an internal conductive pattern layer (not shown) and include a pad 1110 electrically connected to the internal conductive pattern layer. The semiconductor light-emitting device 100 may be mounted on the PCB 1100, and a pad unit PAD of the semiconductor light-emitting device 100 may be connected to the pad 1110 of the PCB 1100 via a bonding wire 1120. At least one driving semiconductor chip 1200 may be configured to drive a plurality of light-emitting device structures 120 of the semiconductor light-emitting device 100 individually or totally.

A molding compound 1130 may be further positioned on the PCB 1100 to surround an edge region of the semiconductor light-emitting device 100. The molding compound 1130 may be positioned to surround an outermost portion of a partition wall structure WS of the semiconductor light-emitting device 100 and cover the pad unit PAD and the bonding wire 1120.

A heat sink 1150 may be attached to a bottom surface of the PCB 1100. Optionally, a thermal interface material (TIM) layer 1160 may be further interposed between the heat sink 1150 and the PCB 1100.

The semiconductor light-emitting devices 100A, 100B, 100C, 100D, 100E, 100F, 100G, 200, 200A, 300, and 400 described with reference to FIGS. 5 to 17 in addition to the semiconductor light-emitting device 100 described with reference to FIGS. 1 to 4 may be mounted on the light source module 1000 alone or in combination.

Figure 20:
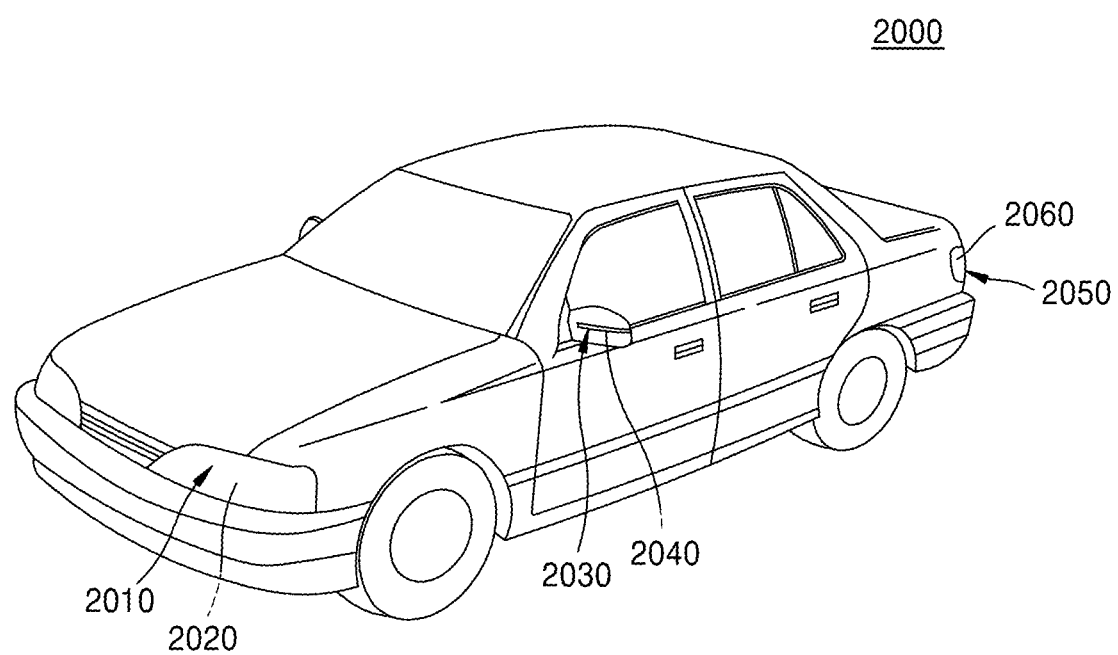
FIGS. 20 to 22 are schematic perspective views of lighting apparatuses including semiconductor light-emitting devices, according to example embodiments.

FIG. 20 is a schematic perspective view of a lighting apparatus including a semiconductor light-emitting device according to example embodiments.

Referring to FIG. 20, a head lamp module 2020 may be installed in a head lamp unit 2010 for a vehicle, a side mirror lamp module 2040 may be installed in an external side mirror unit 2030, and a tail lamp module 2060 may be installed in a tail lamp unit 2050. At least one of the head lamp module 2020, the side mirror lamp module 2040 and the tail lamp module 2060 may be a light source module including at least one of the semiconductor light-emitting devices 100, 100A, 100B, 100C, 100D, 100E, 100F, 100G, 200, 200A, 300, and 400.

Figure 21:
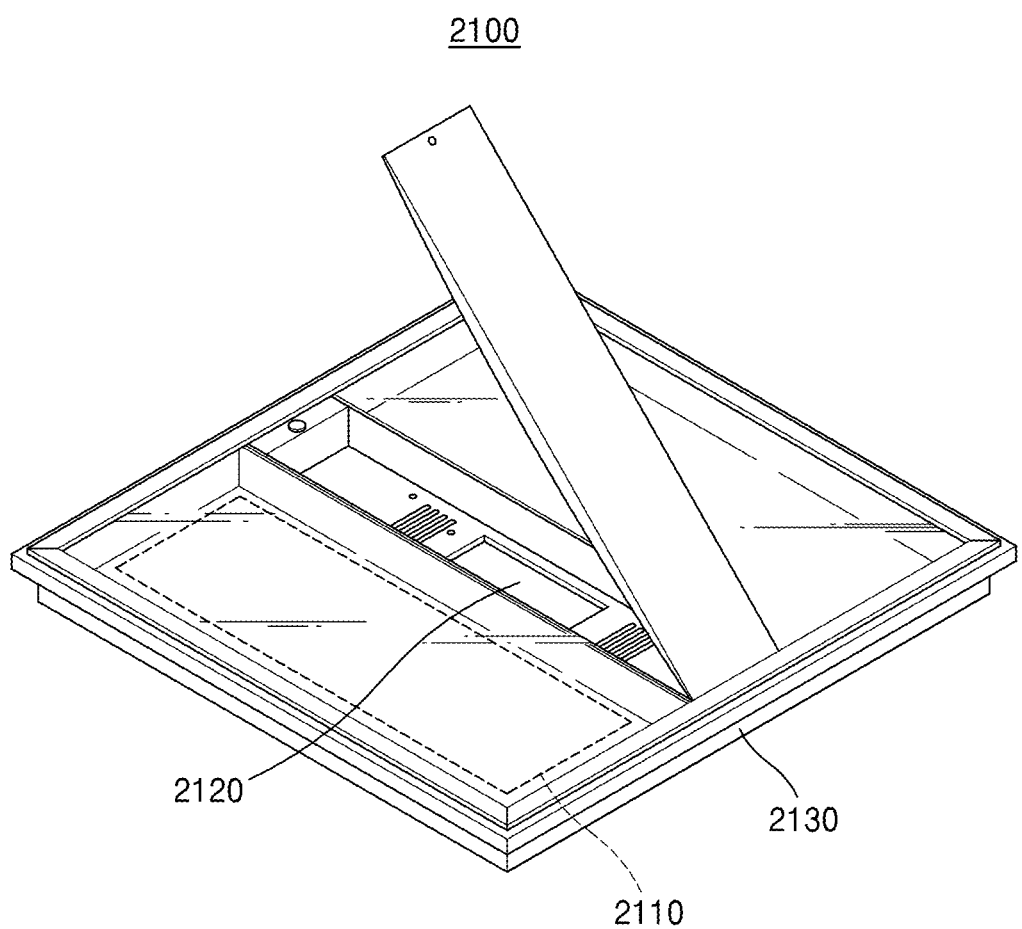

FIG. 21 is a schematic perspective view of a flat-panel lighting apparatus 2100 including a semiconductor light-emitting device, according to example embodiments.

Referring to FIG. 21, the flat-panel lighting apparatus 2100 may include a light source module 2110, a power supply 2120, and a housing 2130.

The light source module 2110 may include a light-emitting device array as a light source and include, as a light source, at least one of the semiconductor light-emitting devices 100, 100A, 100B, 100C, 100D, 100E, 100F, 100G, 200, 200A, 300, and 400 described above. The light source module 2110 may have a flat shape as a whole.

The power supply 2120 may be configured to supply power to the light source module 2110. The housing 2130 may form an accommodation space for accommodating the light source module 2110 and the power supply 2120. The housing 2130 may be formed to have a hexahedral shape with one opened side, but is not limited thereto. The light source module 2110 may be positioned to emit light toward the opened side of the housing 2130.

Figure 22:
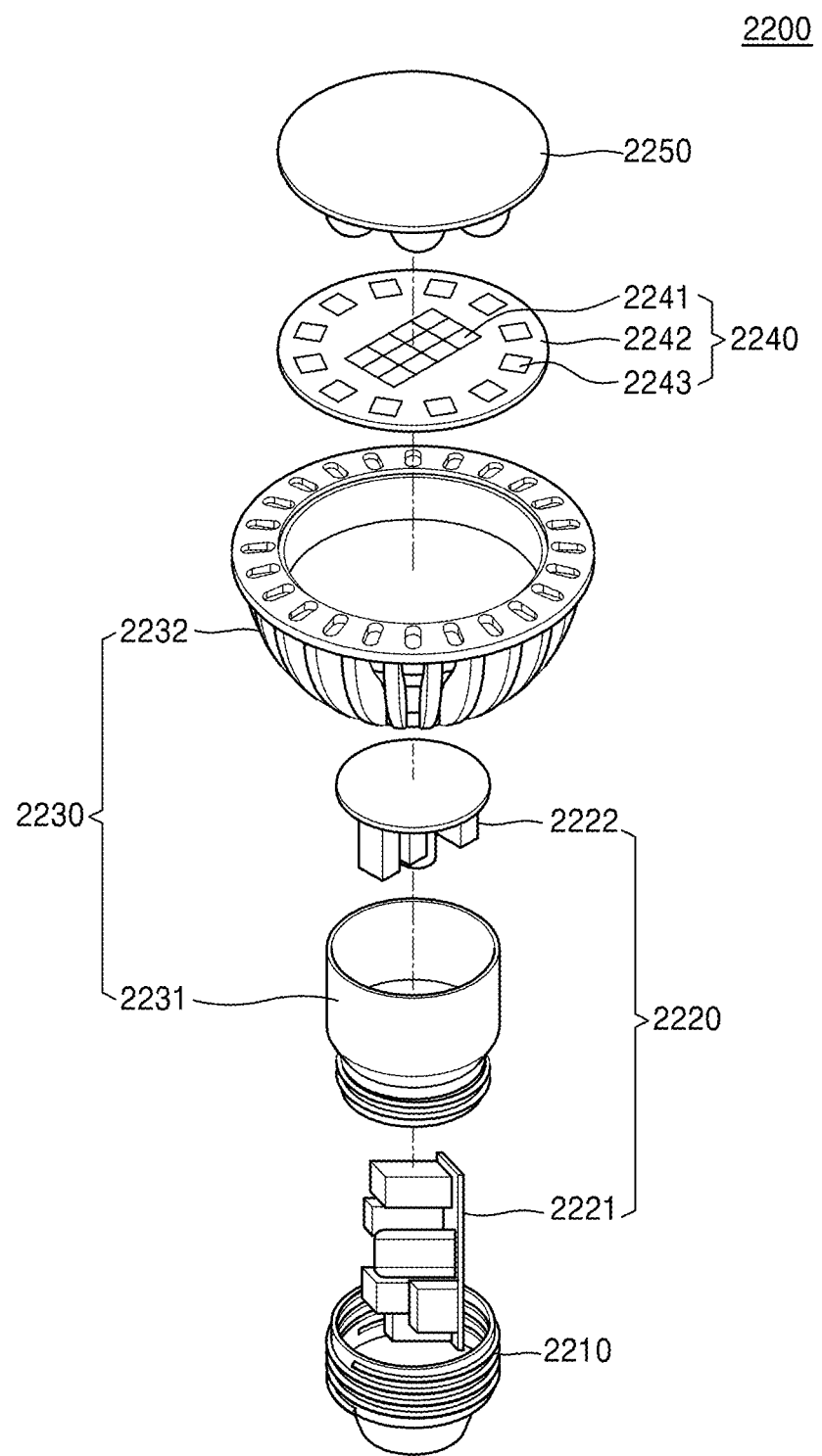

FIG. 22 is an exploded perspective view of a lighting apparatus 2200 including a semiconductor light-emitting device, according to example embodiments.

Referring to FIG. 22, the lighting apparatus 2200 may include a socket 2210, a power supply 2220, a heat sink 2230, a light source module 2240, and an optical unit 2250.

The socket 2210 may be configured to be replaceable with an existing lighting apparatus. Power may be supplied to the lighting apparatus 2200 through the socket 2210. The power supply 2220 may include a first power supply 2221 and a second power supply 2222, which may be assembled together. The heat sink 2230 may include an internal heat sink 2231 and an external heat sink 2232. The internal heat sink 2231 may be directly connected to the light source module 2240 and/or the power supply 2220 and transmit heat to the external heat sink 4232. The optical unit 2250 may include an internal optical unit (not shown) and an external optical unit (not shown). The optical unit 2250 may be configured to uniformly disperse light emitted by the light source module 2240.

The light source module 2240 may receive power from the power supply 2220 and emit light to the optical unit 2250. The light source module 2240 may include at least one light-emitting device package 2241, a circuit board 2242, and a controller 2243, and store driving information of the at least one light-emitting device package 2241. The light-emitting device package 2241 may include a least one of the semiconductor light-emitting devices 100, 100A, 100B, 100C, 100D, 100E, 100F, 100G, 200, 200A, 300, and 400.

While the inventive concept has been particularly shown and described with reference to example embodiments thereof, it will be understood that various changes in form and details may be made therein without departing from the spirit and scope of the following claims.

What is claimed is:

1. A semiconductor light-emitting device comprising a light-emitting pixel region and a pad region, the semiconductor light-emitting device further comprising:
   a plurality of light-emitting structures positioned in the light-emitting pixel region, wherein two adjacent light-emitting structures of the plurality of light-emitting structures are spaced apart from each other with a device isolation region therebetween;
   a partition wall structure positioned in the light-emitting pixel region and at a different vertical level from the plurality of light-emitting structures, the partition wall structure comprising a plurality of partition walls that define a plurality of pixel spaces;
   a passivation structure surrounding a top surface and a sidewall of each of the plurality of partition walls, the passivation structure comprising a first passivation layer comprising a first insulating material and a second passivation layer comprising a second insulating material, wherein the second insulating material is different from the first insulating material;
   a fluorescent layer positioned on the passivation structure and filling the plurality of pixel spaces;
   a lower reflective layer positioned on an inner wall of each of device isolation regions, the lower reflective layer vertically overlapping the plurality of partition walls; and
   a pad unit positioned in the pad region and on at least one side of the plurality of light-emitting structures,
   wherein the passivation structure comprises a first portion positioned on the top surface of each of the plurality of partition walls, a second portion positioned on the sidewall of each of the plurality of partition walls, and a third portion positioned between the plurality of light-emitting structures and the fluorescent layer, and a first thickness of the first portion is less than a second thickness of the second portion.

2. The semiconductor light-emitting device of claim 1, wherein the first thickness of the first portion of the passivation structure is in a range of about 0.1 µm to about 2 µm.

3. The semiconductor light-emitting device of claim 1, wherein a third thickness of the third portion is less than or equal to the second thickness of the second portion.

4. The semiconductor light-emitting device of claim 1, wherein the first passivation layer is conformally positioned on the top surface and the sidewall of each of the plurality of partition walls and on the plurality of light-emitting structures, and/or
   wherein the second passivation layer is positioned on the first passivation layer and covers the top surface and the sidewall of each of the plurality of partition walls.

5. The semiconductor light-emitting device of claim 1, wherein a thickness of the first passivation layer positioned on the top surface of each of the plurality of partition walls is less than or equal to a thickness of the first passivation layer positioned on the sidewall of each of the plurality of partition walls, and/or
   wherein a thickness of the second passivation layer positioned on the top surface of each of the plurality of partition walls is less than or equal to a thickness of the second passivation layer positioned on the sidewall of each of the plurality of partition walls.

6. The semiconductor light-emitting device of claim 1, further comprising:
   a sidewall reflective layer positioned on the second portion of the passivation structure.

7. The semiconductor light-emitting device of claim 1, wherein each of the plurality of partition walls comprises a recess region, the recess region being positioned at a bottom of each of the plurality of partition walls to vertically overlap the device isolation region, and
   wherein a portion of the lower reflective layer extends from the inner wall of the device isolation region into the recess region.

8. The semiconductor light-emitting device of claim 1, wherein the first passivation layer is conformally positioned on the top surface and the sidewall of each of the plurality of partition walls, and
   wherein the second passivation layer is positioned on the sidewall of each of the plurality of partition walls and not positioned on the top surface of each of the plurality of partition walls.

9. The semiconductor light-emitting device of claim 1, wherein the first passivation layer is positioned on the sidewall of each of the plurality of partition walls and not positioned on the top surface of each of the plurality of partition walls, and
   wherein the second passivation layer is conformally positioned on the sidewall and the top surface of each of the plurality of partition walls.

10. The semiconductor light-emitting device of claim 1, wherein the passivation structure further includes a third passivation layer comprising a third insulating material, which is different from the second insulating material,
    wherein the first portion of the passivation structure includes at least one of the first passivation layer, the second passivation layer, and the third passivation layer, and wherein the second portion of the passivation structure includes the first passivation layer, the second passivation layer, and the third passivation layer.

11. The semiconductor light-emitting device of claim 10, wherein the first passivation layer is conformally positioned on the top surface and the sidewall of each of the plurality of partition walls,
wherein the second passivation layer is positioned on the sidewall of each of the plurality of partition walls and not positioned on the top surface of each of the plurality of partition walls, and
wherein the third passivation layer is conformally positioned on the top surface and the sidewall of each of the plurality of partition walls.

12. The semiconductor light-emitting device of claim 1, wherein the partition wall structure includes a trench, which vertically extends from a top portion of each of the plurality of partition walls, and
wherein the passivation structure further includes a first vertical extension portion and a second vertical extension portion, which are respectively positioned on both sidewalls of the trench.

13. The semiconductor light-emitting device of claim 12, wherein a gap is positioned between the first vertical extension portion and the second vertical extension portion.

14. A semiconductor light-emitting device comprising:
a support substrate;
a plurality of light-emitting structures positioned on the support substrate, wherein two adjacent light-emitting structures of the plurality of light-emitting structures are spaced apart from each other with a device isolation region therebetween;
a partition wall structure positioned on the plurality of light-emitting structures and comprising a plurality of partition walls, wherein the plurality of partition walls define a plurality of pixel spaces, and the plurality of pixel spaces vertically overlap the plurality of light-emitting structures, respectively;
a passivation structure positioned on a top surface and a sidewall of each of the plurality of partition walls and bottoms of the plurality of pixel spaces, the passivation structure comprising a first portion positioned on the top surface of each of the plurality of partition walls, a second portion positioned on the sidewall of each of the plurality of partition walls, and a third portion positioned on the bottoms of the plurality of pixel spaces, wherein a first thickness of the first portion is less than a second thickness of the second portion;
a fluorescent layer positioned on sidewalls of the passivation structure and filling the plurality of pixel spaces;
a lower reflective layer positioned on an inner wall of each of device isolation regions , the lower reflective layer vertically overlapping the plurality of partition walls; and
a pad unit positioned on at least one side of the plurality of light-emitting structures.

15. The semiconductor light-emitting device of claim 14, wherein a third thickness of the third portion is less than or equal to the second thickness of the second portion, and
wherein at least one of the first thickness of the first portion of the passivation structure and the third thickness of the third portion of the passivation structure is in a range of about 0.1 μm to about 2 μm.

16. The semiconductor light-emitting device of claim 14, wherein the passivation structure comprises a first passivation layer comprising a first insulating material and a second passivation layer comprising a second insulating material, wherein the second insulating material is different from the first insulating material,
wherein the first passivation layer is conformally positioned on the top surface and the sidewall of each of the plurality of partition walls and the plurality of light-emitting structures, and
wherein the second passivation layer covers the top surface and the sidewall of each of the plurality of partition walls on the first passivation layer.

17. The semiconductor light-emitting device of claim 14, wherein the passivation structure comprises a first passivation layer comprising a first insulating material and a second passivation layer comprising a second insulating material, wherein the second insulating material is different from the first insulating material,
wherein a thickness of the first passivation layer positioned on the top surface of each of the plurality of partition walls is less than or equal to a thickness of the first passivation layer positioned on the sidewall of each of the plurality of partition walls, and
wherein a thickness of the second passivation layer positioned on the top surface of each of the plurality of partition walls is less than or equal to a thickness of the second passivation layer positioned on the sidewall of each of the plurality of partition walls.

18. The semiconductor light-emitting device of claim 14, wherein the passivation structure comprises a first passivation layer comprising a first insulating material, a second passivation layer comprising a second insulating material, and a third passivation layer comprising a third insulating material, wherein the second insulating material is different from the first insulating material, and the third insulating material is different from the second insulating material,
wherein the first portion of the passivation structure comprises at least one of the first passivation layer, the second passivation layer, and the third passivation layer,
wherein the second portion of the passivation structure comprises the first passivation layer, the second passivation layer, and the third passivation layer, and
wherein the third portion of the passivation structure comprises at least one of the first passivation layer, the second passivation layer, and the third passivation layer.

19. A semiconductor light-emitting device comprising:
a support substrate;
a plurality of light-emitting structures positioned on the support substrate, wherein two adjacent light-emitting structures of the plurality of light-emitting structures are spaced apart from each other with a device isolation region therebetween ;
a partition wall structure positioned on the plurality of light-emitting structures and comprising a plurality of partition walls, wherein the plurality of partition walls define a plurality of pixel spaces, and the plurality of pixel spaces vertically overlap the plurality of light-emitting structures, respectively;
a passivation structure positioned on a top surface and a sidewall of each of the plurality of partition walls and bottoms of the plurality of pixel spaces, the passivation structure comprising a first portion positioned on the top surface of each of the plurality of partition walls, a second portion positioned on the sidewall of each of the plurality of partition walls, and a third portion positioned on the bottoms of the plurality of pixel spaces, wherein a first thickness of the first portion is less than a second thickness of the second portion;

a fluorescent layer positioned on sidewalls of the passivation structure and filling the plurality of pixel spaces;

a lower reflective layer positioned on an inner wall of each of device isolation regions, the lower reflective layer vertically overlapping the plurality of partition walls; and a pad unit positioned on at least one side of the plurality of light-emitting structures, the pad unit having a top surface positioned at a lower level than a top surface of the partition wall structure.

20. The semiconductor light-emitting device of claim 19, wherein the passivation structure comprises a first passivation layer comprising a first insulating material, a second passivation layer comprising a second insulating material, and a third passivation layer comprising a third insulating material, wherein the second insulating material is different from the first insulating material, and the third insulating material is different from the second insulating material, wherein the first portion of the passivation structure comprises at least one of the first passivation layer, the second passivation layer, and the third passivation layer, wherein the second portion of the passivation structure comprises the first passivation layer, the second passivation layer, and the third passivation layer, and wherein the third portion of the passivation structure comprises at least one of the first passivation layer, the second passivation layer, and the third passivation layer.

* * * * *